United States Patent [19]
Makiuchi et al.

[11] Patent Number: 5,668,386
[45] Date of Patent: Sep. 16, 1997

[54] PLANAR PHOTODETECTION DEVICE SUITABLE FOR FLIP-CHIP PROCESS AND A FABRICATION PROCESS OF SUCH A PLANAR PHOTODETECTION DEVICE

[75] Inventors: Masao Makiuchi; Naoki Yamamoto, both of Kawasaki, Japan

[73] Assignee: Fujitsu Limited, Kawasaki, Japan

[21] Appl. No.: 506,602

[22] Filed: Jul. 25, 1995

[30] Foreign Application Priority Data

Sep. 19, 1994 [JP] Japan .................. 6-223807

[51] Int. Cl.$^6$ ............................. H01L 31/0328
[52] U.S. Cl. ................ 257/184; 257/443; 257/458; 257/459; 257/737; 257/745
[58] Field of Search ........................ 257/184, 443, 257/458, 459, 460, 737, 738, 778, 745

[56] References Cited

U.S. PATENT DOCUMENTS

| | | | |
|---|---|---|---|
| 5,107,318 | 4/1992 | Makiuchi et al. | 257/458 |
| 5,376,584 | 12/1994 | Agarwala | 257/738 |

OTHER PUBLICATIONS

"Easily Manufactured High–Speed Back–Illuminated GaInAs/InP p–i–n Photodiode", Makiuchi et al, *IEEE Photonics Technology Letters*, vol. 3, No. 6, Jun. 1991, pp. 530–531.

"Back–Illuminated InGaAs/InP-pin Photodiode Array", Norimatsu et al, Abstract C–123 of the Fall Meeting of IEICE 1992, 1992.

"Back–Illuminated InGaAs/InP-pin Photodiode Array", Yamamoto et al, Abstract C–298 of the Spring Meeting of IEICE 1994, 1994.

*Primary Examiner*—Minh-loan Tran
*Attorney, Agent, or Firm*—Nikaido, Marmelstein, Murray & Oram LLP

[57] ABSTRACT

A semiconductor photodetection device includes a semiconductor layer of a first conductivity type in which a pair of conductive regions of a second conductivity type are formed, the first conductive region acting as a photodiode and having an area substantially smaller than the area of the second conductive region, wherein the second conductive region carries a second metal bump of which area is at least ten times as large as a first metal bump that is provided on the first conductive region.

16 Claims, 25 Drawing Sheets

5,668,386

1

PLANAR PHOTODETECTION DEVICE SUITABLE FOR FLIP-CHIP PROCESS AND A FABRICATION PROCESS OF SUCH A PLANAR PHOTODETECTION DEVICE

BACKGROUND OF THE INVENTION

The present invention generally relates to optical semiconductor devices and more particularly to a planer photodetection device suitable for mounting on a substrate according to a flip-chip process.

Semiconductor photodetection devices are key elements in the field of optical telecommunications as well as in the newly emerged field of multi-media. In multi-media applications, image data and audio data are processed together with other information such as text information. Thus, there is a need for processing huge amount of information in the multi-media applications, and such huge amount of information is transmitted through an optical fiber cable in the form of optical signals. In order to reduce the cost of multi-media systems and apparatuses, there is a demand for a planar semiconductor photodetection device that allows mounting upon a printed circuit board or a tape lead by a flip-chip process.

The inventor of the present invention has previously proposed a planar photodetection device suitable for flip-chip mounting. See, for example, U.S. Pat. No. 5,107,318, or Makiuchi, et al., IEEE Photonics Technology Letters, vol.3, no.6, June 1991.

FIG. 1 shows the construction of such a conventional semiconductor photodetection device 10 proposed by the inventor.

Referring to FIG. 1 showing a semiconductor photodetection device 10, the device 10 is mounted upon a ceramic support substrate 1 carrying thereon wiring patterns 1a and 1b and includes a layered semiconductor body that in turn includes an InP substrate 2 of the n-type, wherein the substrate 2 carries thereon an InP layer 3 of the n$^+$-type. Further, an undoped InGaAs layer 4 is grown on the InP layer 3 and an InP layer 5 of the n$^-$-type is grown on the InGaAs layer 4, wherein the n$^-$-type InP layer 5 includes p-type regions 5a and 5b doped by a diffusion of Zn.

It should be noted that the p-type regions 5a and 5b has a surface on which conductor layers of Au, Zn and Au are deposited consecutively (Au/Zn/Au), wherein the conductor patterns thus deposited are heat-treated to form an ohmic electrode in each of the p-type regions 5a and 5b. Further, those parts of the regions 5a and 5b that are not covered by the ohmic electrodes are covered by SiN patterns 6a and 6b. Thus, the SiN pattern 6a covers the exposed surface of the p-type region 5a while the SiN pattern 6b covers the exposed surface of the p-type region 5b. In addition, a polyimide layer 7 is provided on the InP layer 5 such that the polyimide layer 7 buries the SiN patterns 6a and 6b underneath, and the polyimide layer 7 is formed with a contact hole that exposes the ohmic electrode in each of the p-type regions 5a and 5b. Further, metal bumps 8a and 8b are provided in contact with the ohmic electrodes thus formed on the p-type regions 5a and 5b, via respective contact holes.

As shown in FIG. 1, the layered semiconductor body thus formed is turned over and mounted upon the support substrate 1 by a flip-chip process, such that the foregoing metal bumps 8a and 8b establish a contact with the corresponding wiring patterns 1a and 1b.

In the construction of FIG. 1, it will also be noted that the lower major surface of the substrate 2, which corresponds to

2 the top surface in the mounted state of FIG. 1, is formed with a microlens 2a in correspondence to the diffusion region 5b for focusing an incident optical beam upon the diffusion region 5b. Further, the foregoing lower major surface of the substrate 2 is covered by an anti-reflection film 9 such that the anti-reflection film 9 covers the microlens 2a.

In such a construction of FIG. 1, it will be noted that the p-type diffusion regions 5a and 5b form diodes D1 and D2 respectively, wherein the diode D2 corresponding to the diffusion region 5a acts as a photodiode and detects the incident optical beam. On the other hand, the diode D1 of the diffusion region 5b is connected to the diode D2 in series and drives the same by supplying a drive current. In other words, the diode D1 acts as a drive diode.

FIG. 2 shows an equivalent circuit diagram of the photodetection device 10 of FIG. 1.

Referring to FIG. 2, the photodetection device 10 is connected to a d.c. power supply E that causes a forward biasing of the diode D1 by supplying a drive current I, wherein the drive current I is further supplied, from the diode D1, to the diode D2. Thereby, the diode D2 experiences a reverse biasing and causes a conduction in response to an incident optical beam. Upon conduction of the diode D2, an output signal is obtained at an output terminal.

In such a construction, it should be noted that the diode D1, which merely acts as a drive circuit for supplying the drive current to the diode D2, is allowed to have a large parasitic capacitance, while the diode D2, which is used a photodiode, is required to have a very small parasitic capacitance for high speed response. Thus, the diffusion region 5b has an area much larger than the area of the diffusion region 5a. For example, Makiuchi et al., op. cit teaches that the area of the diffusion region 5b is set 160 times as large as the area of the diffusion region 5a. Thereby, Makiuchi et al. has successfully reduced the parasitic capacitance of the diffusion region 5a to 0.15 pF by forming the circular-shaped diffusion region 5a to have a diameter of about 40 μm. In this case, the diffusion region 5a is formed to have a rectangular shape with a size of 300×200 μm. In this case, one obtains a junction capacitance of about 6 pF for the diffusion region 5b.

FIG. 3 shows a semiconductor photodetection integrated circuit in which a number of photodetection devices each having a construction of FIG. 1 are arranged on a common substrate to form an array.

Referring to FIG. 3, the n-type InP substrate 2 carries thereon the n$^+$-type InP layer 3 and the undoped InGaAs layer 4, and the layer 4 is covered by the n$^-$-type InP layer 5 similarly to the construction of FIG. 1. In the example of FIG. 3, the layer 5 includes a number of p$^+$-type diffusion regions corresponding to the p-type regions 5a and 5b, wherein there is formed an array of metal bumps including a first row of metal bumps formed of the metal bumps 8a and a second row of metal bumps formed of the metal bumps 8b. It should be noted that each of the metal bumps 8a covers a substantial area of the small diffusion region 5a, while the metal bump 8b covers only a part of the large diffusion region 5b. Thereby, a metal bump 8a generally has an area comparable with that of a metal bump 8b.

The semiconductor photodetection integrated circuit of FIG. 3 is mounted upon a support substrate similar to the substrate 1 of FIG. 1, wherein the integrated circuit is supported by the metal bumps 8a and 8b. It should be noted thereby that, when the metal bumps 8a and 8b are formed to have a similar size, the load or weight of the integrated circuit is distributed uniformly between the metal bumps 8a and the metal bumps 8b. In other words, the diffusion region 5a of the diode D2, of which area is much smaller than the area of the diffusion region 5b, inevitably experiences a very large mechanical stress. When a mechanical stress is applied to the diffusion region of a photodiode, the photodetection characteristics of the diode are inevitably deteriorated. This problem emerges in the form of increased dark current, for example.

Further, the conventional photodetection integrated circuit of FIG. 3 has another drawback in that the mechanical load applied externally to the metal bump 8a is directly transmitted to the diffusion region 5a of the photodiode D2. It should be noted that the photodetection integrated circuit of FIG. 3 tends to experience an external stress when connecting an optical fiber to the rear side of the layered semiconductor body, wherein the rear side of course corresponds to the top side of the layered semiconductor body when the device is flip-chip mounted upon the support substrate. As the optical fiber is directly connected to the part where the photodiode D2 is formed, the photodetection integrated circuit of such a construction is particularly vulnerable to external stress or shock applied to the optical fiber.

In addition, the photodetection integrated circuit of FIG. 1 or FIG. 3, in which the metal bumps 8a or 8b are generally formed by patterning the conductor layer by a lift-off process, has another drawback in that such a lift-off process wastes valuable materials of the electrode.

SUMMARY OF THE INVENTION

Accordingly, it is a general object of the present invention to provide a novel and useful semiconductor photodetection device and a fabrication process thereof wherein the foregoing problems are eliminated.

Another and more specific object of the present invention is to provide a semiconductor photodetection device suitable for mounting by a flip-ship process wherein the mechanical load applied to a diffusion region that forms a photodiode in the photodetection device is minimized.

Another object of the present invention is to provide a fabrication process of a semiconductor photodetection device in which metal bumps are formed with low cost by an electroplating process, as well as a semiconductor photodetection device having a structure suitable for such a fabrication process that includes electroplating of metal bumps.

Another object of the present invention is to provide a semiconductor photodetection device, comprising:

a substrate;

a first semiconductor layer of a first conductivity type provided on said substrate;

a second semiconductor layer of said first conductivity type and provided on said first semiconductor layer;

a first conductive region formed in said second semiconductor layer and having a second, opposite conductivity type;

a second conductive region formed in said second semiconductor layer with a separation from said first conductive region, said second conductive region having said second conductivity type and an area substantially larger than an area of said first conductive region;

a first metal bump provided on said second semiconductor layer in correspondence to said first conductive region, said first metal bump having a first area; and a second metal bump provided on said second semiconductor layer in correspondence to said second conductive region, said second metal bump having a second area;

said first and second metal bumps projecting from said second semiconductor layer with a substantially identical distance;

wherein said second area is at least ten times as large as said first area.

According to the present invention, it is possible to avoid the problem of the photodiode, formed in the photodetection device in correspondence to the first diffusion region, experiences a mechanical stress when a load is applied to the photodetection device as in the case of mounting the device upon a support substrate or connecting an optical fiber thereto. It should be noted that most of the load applied to the photodetection device is supported by the second metal bump that has a substantially larger area and hence an increased rigidity with respect to the first metal bump, and the first diffusion region is maintained substantially free from mechanical stress. As the second metal bump is provided on the second diffusion region that forms the drive diode and not on the first diffusion region, such an increased size of the metal bump does not cause any problem in the performance of the photodetection device.

Another object of the present invention is to provide a semiconductor photodetection device, comprising:

a substrate;

a first semiconductor layer of a first conductivity type provided on said substrate;

a second semiconductor layer of said first conductivity type and provided on said first semiconductor layer;

a first conductive region formed in said second semiconductor layer and having a second, opposite conductivity type;

a first metal bump provided on said second semiconductor layer in correspondence to said first conductive region with a first area;

a plurality of elemental conductive regions each formed in said second semiconductor layer with a mutual separation and with a separation from said first conductive region, each of said elemental conductive regions having a second, opposite conductivity type; and a plurality of metal bump elements each provided on a corresponding one of said elemental conductive regions, each of said metal bump elements having an area identical to an area of said first metal bump;

said first metal bump and said metal bump elements projecting from said second semiconductor layer with a substantially identical distance;

wherein said plurality of metal bump elements having a total area, defined as a sum of the area of all of said metal bump elements, of at least ten times as large as said first area.

According to the present invention, the load applied to the photodetection device is distributed to the plurality of metal bump elements, and the first conductive region which is essential for the operation of the photodetection device is maintained substantially free from external stress. Further, the structure of the present invention as set forth above is advantageous for forming the metal bump and the metal bump elements by an electroplating process. By conducting an electrodepositon of the metal bump elements by applying a predetermined bias voltage to each of the elemental conductive regions, it is possible to guarantee a substantially uniform thickness for the metal bump elements thus grown. Further, by forming the first conductive region and the first metal bump to be identical or equivalent to other elemental conductive regions and the bump elements, respectively, it is possible to use any of the elemental conductive region and a corresponding metal bump element for a photodiode. Thereby, the degree of freedom for using the photodetection device such as the design of a photodetection circuit, increases substantially.

Another object of the present invention is to provide a semiconductor photodetection device, comprising:

a substrate;

a first semiconductor layer of a first conductivity type and provided on said substrate;

a second semiconductor layer provided on said first semiconductor layer and having said first conductivity type;

a conductive region formed in said second semiconductor layer with a second, opposite conductivity type;

a metal bump provided on said second semiconductor layer in correspondence to said conductive region;

a first insulation layer provided on said second semiconductor layer so as to cover said conductive region, said first insulation layer having a first opening that exposes a part of said conductive region;

a second insulation layer provided on said first insulation layer so as to cover said first insulation layer, said second insulation layer having a second opening larger than said first opening such that said second opening surrounds said first opening;

said metal bump contacting with said conductive region via said first and second openings.

According to the present invention, there are formed steps at the first and second contact holes, and the metal bump that contacts with the conductive region via the first and second contact holes has an increased side wall area as compared with the case in which the metal bump is contacted to the conductive region via a single contact hole. Because of the increased path length along the side wall of the metal bump, the chance of a molten solder alloy penetrating into the gap between the metal bump and the side wall of the contact holes and causing a short circuit at the conductive region, is substantially reduced.

Another object of the present invention is to provide a semiconductor photodetection device, comprising:

a substrate having first and second, mutually opposing principal surfaces;

a first semiconductor layer provided on said first principal surface of said substrate and having a first conductivity type;

a second semiconductor layer provided on said first semiconductor layer and having said first conductivity type:

a first conductive region formed in said second semiconductor layer, said first conductive region having a second, opposite conductivity type;

a second conductive region formed in said second semiconductor layer with a separation from said first conductive region, said second conductive region having said second conductivity type, said second conductive region having an area substantially larger than an area of said first conductive region;

a first metal bump provided on said second semiconductor layer in correspondence to said first conductive region, said first metal bump having a first area; and a second metal bump provided on said second semiconductor layer in correspondence to said second conductive region, said second metal bump having a second area;

said first and second metal bumps projecting from said second semiconductor layer with a substantially identical distance;

a resin layer provided on said second principal surface of said substrate;

an opening provided on said resin layer in correspondence to said first diffusion region such that said second principal surface is exposed; and an optical fiber having an end engaging with said opening, said optical fiber thereby emitting an optical signal in the vicinity of said first conductive region;

wherein said second area is at least ten times as large as said first area.

According to the present invention, the opening formed in the resin layer provides a guide for holding the end of the optical fiber. Thus, the optical fiber and the photodiode in the photodetection device are easily coupled while maintaining an optical alignment. Further, such a construction avoids transmission of mechanical stress to the junction region that is essential for the operation of the photodiode.

Another object of the present invention is to provide a method for fabricating a semiconductor photodetection device, comprising the steps of:

depositing a first semiconductor layer having a first conductivity type on a substrate having said first conductivity type;

depositing a second semiconductor layer having said first conductivity type on said first semiconductor layer;

forming a conductive region having a second, opposite conductivity type in said second semiconductor layer;

depositing an insulator layer on said second semiconductor layer;

forming a contact hole in said insulator layer such that a part of said conductive region is exposed;

depositing a metal bump upon said expose part of said conductive region by an electroplating process, said electroplating process including a step of applying a voltage to said conductive region.

According to the present invention, the metal bump is selectively formed on the conductive region, without applying any patterning process. Thereby, the problem of loss of the electrode material associated with such a patterning process does not occur.

Other objects and further features of the present invention will become apparent from the following detailed description when read in conjunction with the attached drawings.

BRIEF DESCRIPTION OF THE PREFERRED EMBODIMENTS

DETAILED DESCRIPTION OF THE PREFERRED EMBODIMENTS

Figure 4A:
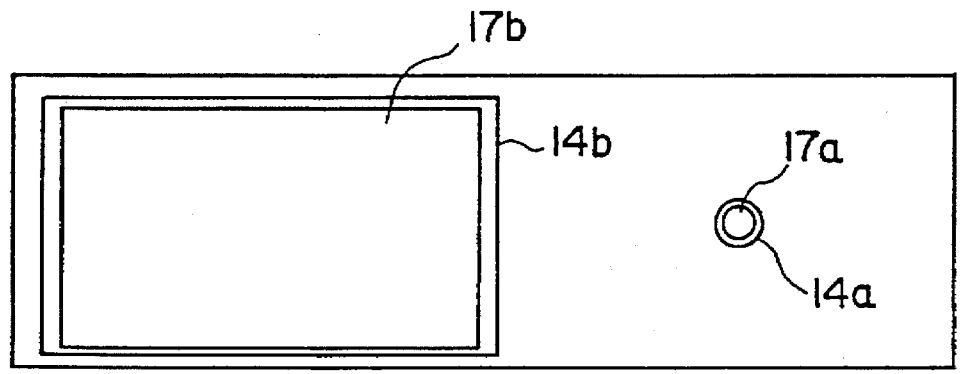
FIGS. 4 and 4B are diagrams showing the construction of a semiconductor photodetection device according to a first embodiment of the present invention respectively in a plan view and in a cross sectional view.
Figure 4B:
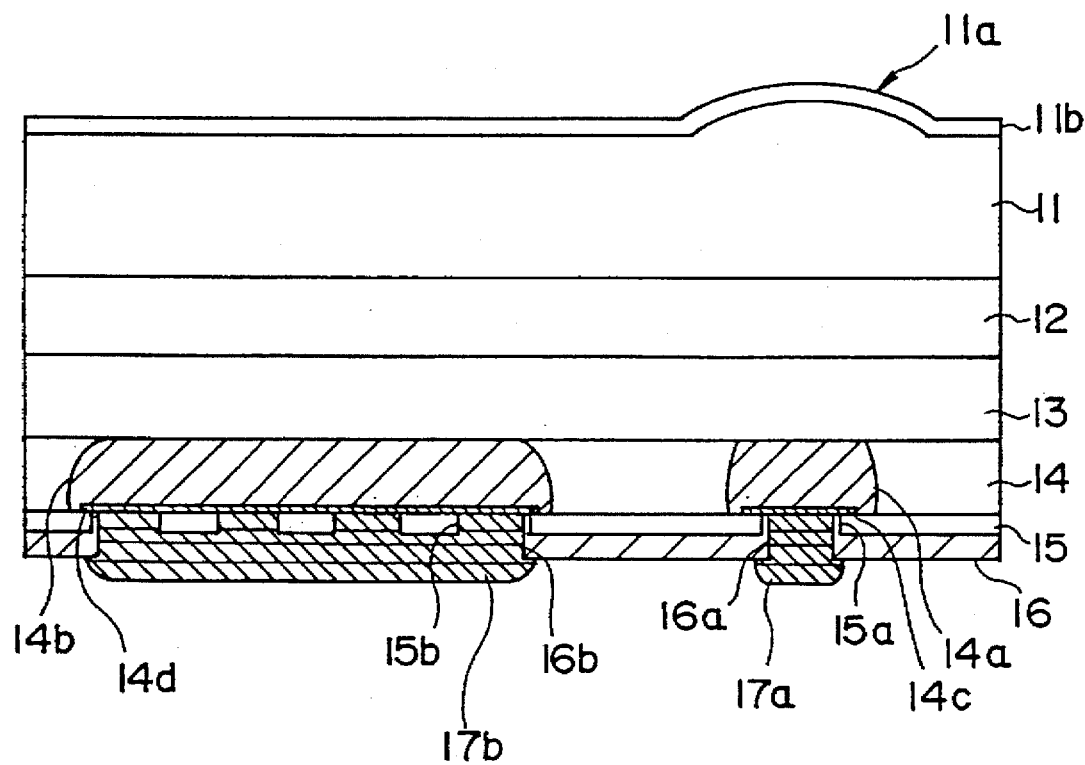

FIGS. 4A and 4B show the construction of a semiconductor photodetection device according to a first embodiment of the present invention, wherein FIG. 4A shows the photodetection device in a plan view while FIG. 4B shows the same device in a cross sectional view. In the cross sectional view of FIG. 4B, it should be noted that the photodetection device is shown in a turned-over state ready for flip-chip mounting upon a substrate. In the explanation hereinafter, the vertical orientation for the original, not-turned-over state of the device will be employed for the sake of clarity.

Figure 1:
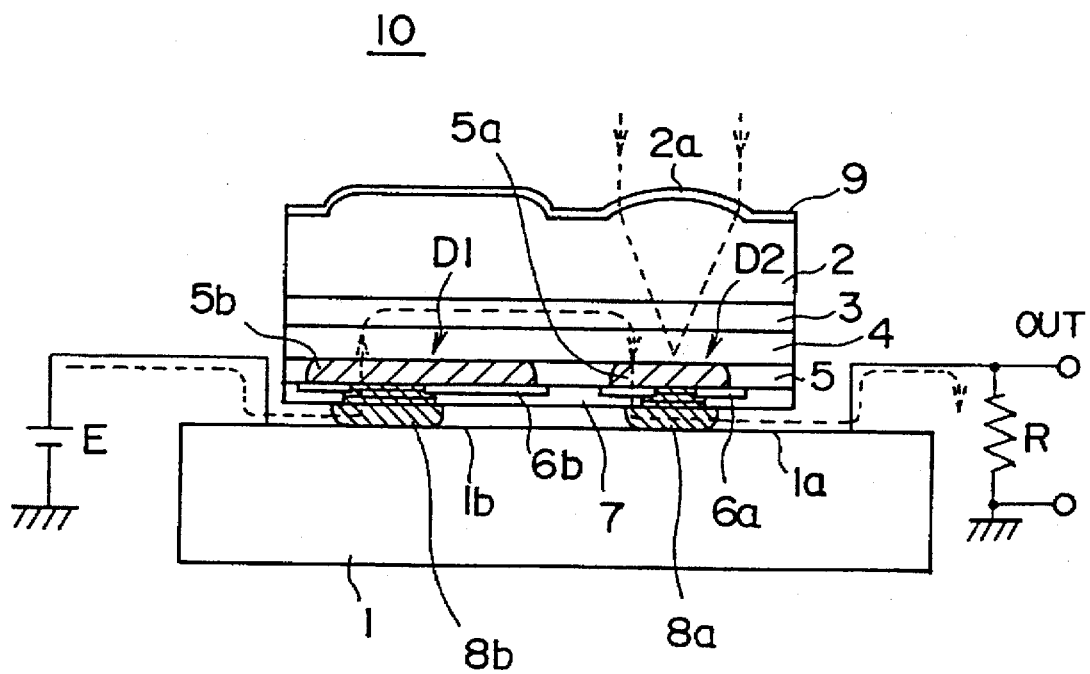
FIG. 1 is a diagram showing the construction of a conventional semiconductor photodetection device in a cross sectional view.
Figure 2:
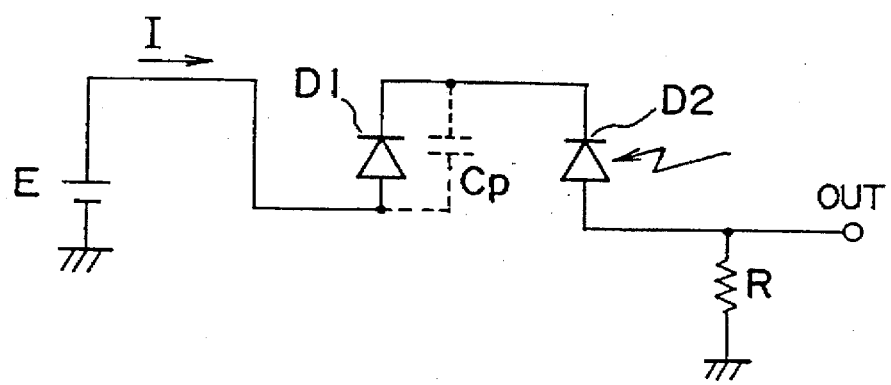
FIG. 2 is a circuit diagram showing an equivalent circuit diagram of the semiconductor photodetection device of FIG. 1.
Figure 3:
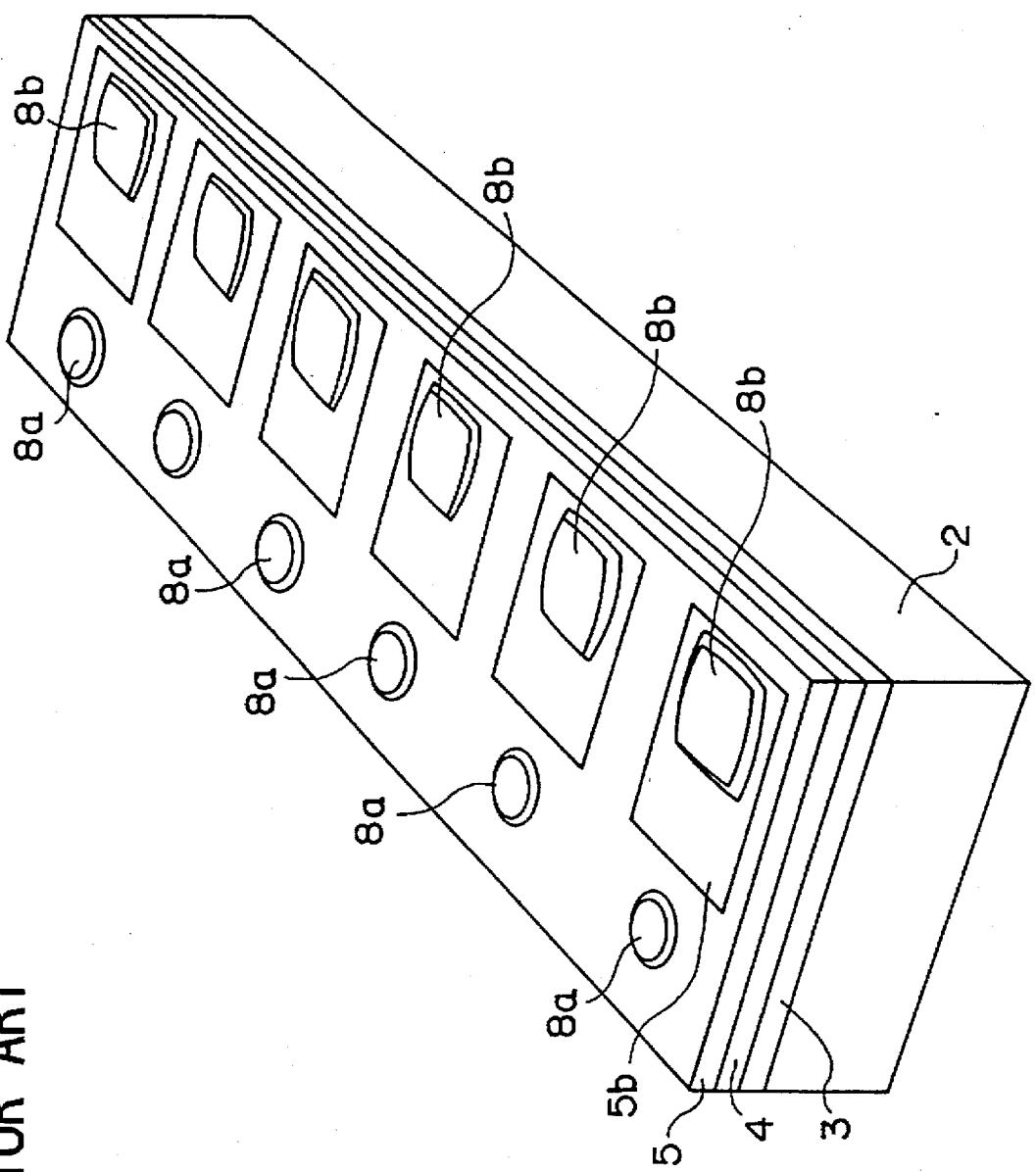
FIG. 3 is a diagram showing the construction of an optical semiconductor integrated circuit in which the semiconductor photodetection devices of FIG. 1 are arranged to form an array.

Referring to the cross sectional view of FIG. 4B first, it will be noted that the photodetection device includes a layered semiconductor body similar to the one described in FIG. 1. More specifically, the photodetection device includes an InP substrate 11 of the n-type carrying a microlens 11a on a lower major surface thereof (upper major surface in the illustrated state). On the InP substrate 11, an InP layer 12 of the $n^+$-type is formed epitaxially, and an undoped InGaAs layer 13 is provided on the InP layer 12 also epitaxially. Further, an InP layer 14 of the $n^-$-type is formed on the InGaAs layer 13 epitaxially, wherein the layer 14 is formed with a first p-type diffusion region 14a that forms an essential part of a photodiode corresponding to the photodiode D2 of the photodetection device. Further, another p-type diffusion region 14b is formed in the layer 14 with a separation therefrom, wherein the p-type region 14b forms an essential part of a drive diode corresponding to the diode D1 of FIG. 2.

In order to secure a fast response, the diffusion region 14a is formed to have as much small area as possible such that the parasitic capacitance associated with the diffusion region 14a is minimized. Typically, the diffusion region 14a is formed to have a circular shape with a diameter of about 40 μm. In contrast, the diffusion reign 14b is typically formed to have a size of 300 μm×200 μm.

In the foregoing layered structure, it should be noted that the undoped AlGaAs layer 13 acts as an optical absorption layer and typically has a thickness of about 3 μm. Further, ohmic electrodes 14c and 14d, each formed of a stacking of an AuZn alloy layer and an Au layer, are formed on the diffusion regions 14a and 14b, respectively. Furthermore, it will be noted that an anti-reflection film 11b is provided on the lower major surface of the substrate 11 so as to cover the microlens 11a.

On the InP layer 14, there is provided an insulation layer 15 typically formed of SiN or $SiO_2$ with a thickness of about 200 nm, and the insulation layer 15 is formed with a contact hole 15a that exposes the diffusion region 14a. Further, the insulation layer 15 includes a number of contact holes 15b each exposing the diffusion region 14b, wherein the contact holes 15b are formed over the entirety of the diffusion region 14b with a mutual separation. The insulation layer 15 is further covered by another insulation layer 16 of polyimide having a thickness of 3–4 μm, and the insulation layer 16 is provided with a contact hole 16a corresponding to the foregoing contact hole 15a and a single large contact hole 16b corresponding to the diffusion region 14b. The contact hole 16b has a size corresponding to the size of the diffusion region 14b.

On the insulation layer 16, there is provided a first metal bump 17a having a diameter of about 30 µm such that the metal bump 17a makes a contact with the ohmic electrode 14c on the diffusion region 14a via the contact holes 15a and 16a. Similarly, another metal bump 17b is provided on the insulation layer 16 such that the metal bump 17b makes a contact with the ohmic electrode 14d on the diffusion region 14b via the contact hole 16b and further via the contact holes 15b. Each of the metal bumps 17a and 17b has a stacking structure of Cu, Au and Sn layers (Cu/Au/Sn) from the bottom to the top thereof. Alternatively, one may use a stacking structure of Au and Sn layers (Au/Sn) or Cu and Sn layers (Cu/Sn). Thereby, the metal bump 17a has a circular shape as indicated in the plan view of FIG. 4A, while the metal bump 17b has a rectangular shape. As explained above, the metal bump 17a has a diameter of about 30 µm that is substantially equal to the diameter of the corresponding diffusion region 14a. On the other hand, the metal bump 17b has a size of about 300×200 µm that is substantially equal to the size of the corresponding diffusion region 14b. Thus, the metal bump 17b has an area about 85 times as large as the area of the metal bump 17a.

When a photodetection device as such is mounted upon a support substrate or tape lead by a flip-chip process, most of the mechanical load applied to the photodetection device is carried by the metal bump having larger area, and the smaller metal bump is kept substantially free from a mechanical stress. In other words, no substantial stress is transmitted to the diffusion region 14a via the metal bump 17a, and the problem of increased dark current caused in the conventional photodetection device due to the stress applied to the diffusion region, is successfully eliminated.

Figure 5:
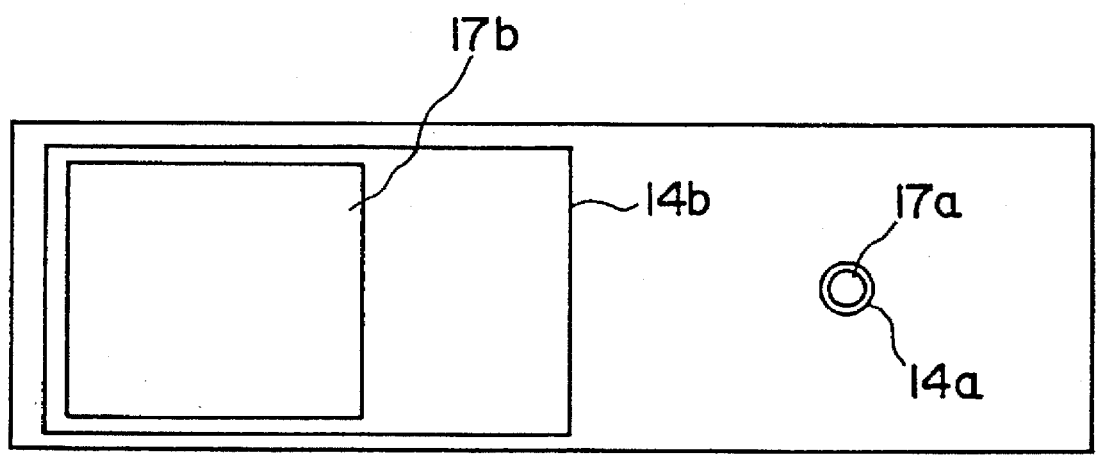
FIG. 5 is a diagram showing a modification of the semiconductor photodetection device of the first embodiment in a plan view.

In such a photodetection device, it is not always necessary to form the metal bump 17b to cover the entire surface of the diffusion region 14b that forms the drive diode. Thus, one may modify the present invention as indicated in FIG. 5, wherein it will be noted that the metal bump 17b has a size of 130 µm×130 µm. In FIG. 5, it should be noted that the diffusion regions 14a and 14b have identical size and shape with those shown in FIGS. 4A and 4B. In this case, the area of the metal bump 17b is about 24 times as large as the area of the metal bump 17a. Generally, it is desired to form the metal bump 17b to have an area at least ten times as large as the area of the metal bump 17a.

Figure 6A:
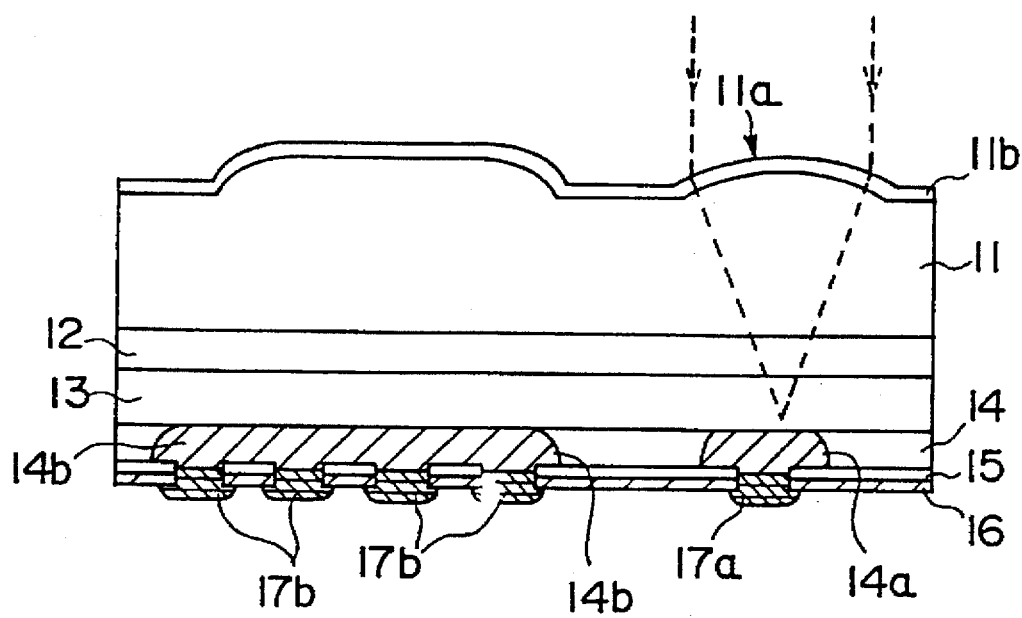
FIGS. 6A and 6B are diagrams showing the construction of a semiconductor photodetection device according to a second embodiment of the present invention respectively in a cross sectional view and in a plan view.
Figure 6B:
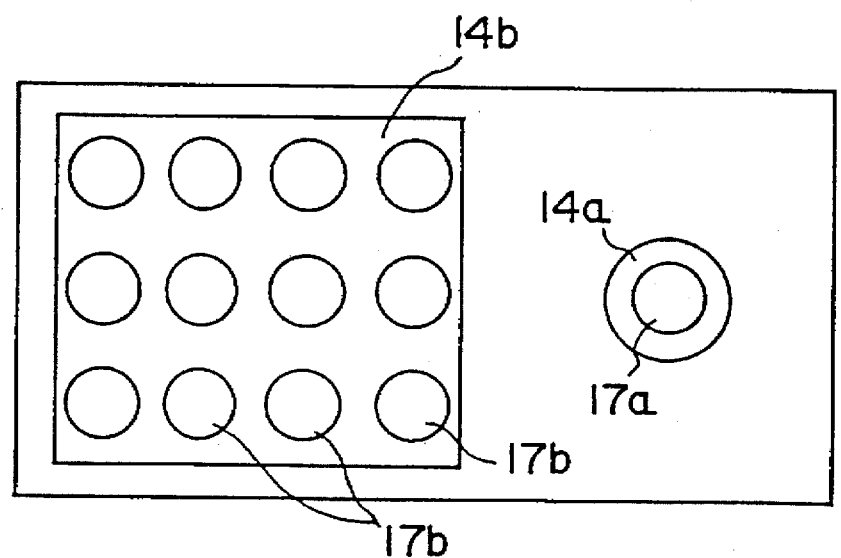

FIGS. 6A and 6B show the construction of the semiconductor photodetection device according to a second embodiment of the present invention, wherein FIG. 6A shows the cross section while FIG. 6B shows the plan view of the device. In FIGS. 6A and 6B, those parts corresponding to the parts described previously are designated by the same reference numerals, and the description thereof will be omitted.

Generally, a semiconductor photodetection device for flip-chip mounting is formed by a process that includes a step of forming the metal bumps by patterning a conductor layer. More specifically, such a step includes the substeps of depositing a resist layer, patterning the resist layer by a photolithographic process to form an opening in the resist layer, depositing a conductor layer so as to fill the opening, and lifting off the conductor layer remaining on the resist layer.

However, such a process has an obvious drawback in that it wastes valuable electrode materials such as Au at the time of the lift-off. In order to reduce the cost, one may form the metal bumps by an electroplating process. In the electroplating process, it should be noted that metal bumps are grown selectively on the ohmic electrodes on the diffusion regions 14a and 14b by applying a voltage to the diffusion regions. No patterning process is necessary. As the diffusion regions 14a and 14b provide a sufficient conductivity due to the high impurity concentration level therein, the electroplating process is thought a convenient process for growing the metal bumps selectively on the diffusion regions 14a and 14b.

When implementing such an electroplating process to the structure of FIGS. 4A and 4B to grow the metal bumps 17a and 17b, however, there arises a problem in that, the metal bump 17b, having a much larger area as compared with the metal bump 17a, grows more rapidly than the metal bump 17a due to the reduced resistance of the current path. Thereby, the metal bump 17b tends to have an increased height on the InP layer 14 as compared with the meal bump 17a. When such a difference appears in the height of the metal bumps, the desired flip-chip mounting of the photodetection device becomes substantially difficult.

In the present embodiment, the metal bump 17b of FIGS. 4A and 4B is divided into a plurality of metal bumps each having an area substantially identical to the area of the metal bump 17a as indicated in FIGS. 6A and 6B.

Referring to FIG. 6A, it will be noted that the contact holes 16b formed in the insulation layer 16 is now formed with a plural number such that each contact hole 16b corresponds to a contact hole 15a formed in the insulation layer 15. Thus, the metal bump 17b of FIGS. 4A and 4B is now divided into a plurality of metal bump elements in the present embodiment, wherein the metal bump elements are designated also by the reference numeral 17b. As indicated in the plan view of FIG. 6B, the metal bumps 17b are arranged in a row and column formation.

In such a construction, it should be noted that the current flowing through the part of the diffusion region 14b on which the metal bump element 17b is to be grown, becomes substantially identical with the current flowing through the diffusion region 14a, and the metal bump elements 17b are grown with a height substantially identical with the height of the metal bump 17a. By using the photodetection device constructed as such for the flip-chip mounting, all of the metal bump elements 17a as well as the metal bump 17a are contacted positively with a corresponding wiring pattern on a support substrate such as the one shown in FIG. 1.

In the present embodiment, it should be noted that the metal bump elements 17b are formed such that the total area of the metal bump elements 17b is at least ten times as large as the are of the metal bump 17a. Thereby, any mechanical load applied to the photodetection device is carried substantially by the metal bump elements 17b, and the diffusion region 14a of the photodiode is held substantially free from stress.

Figure 7:
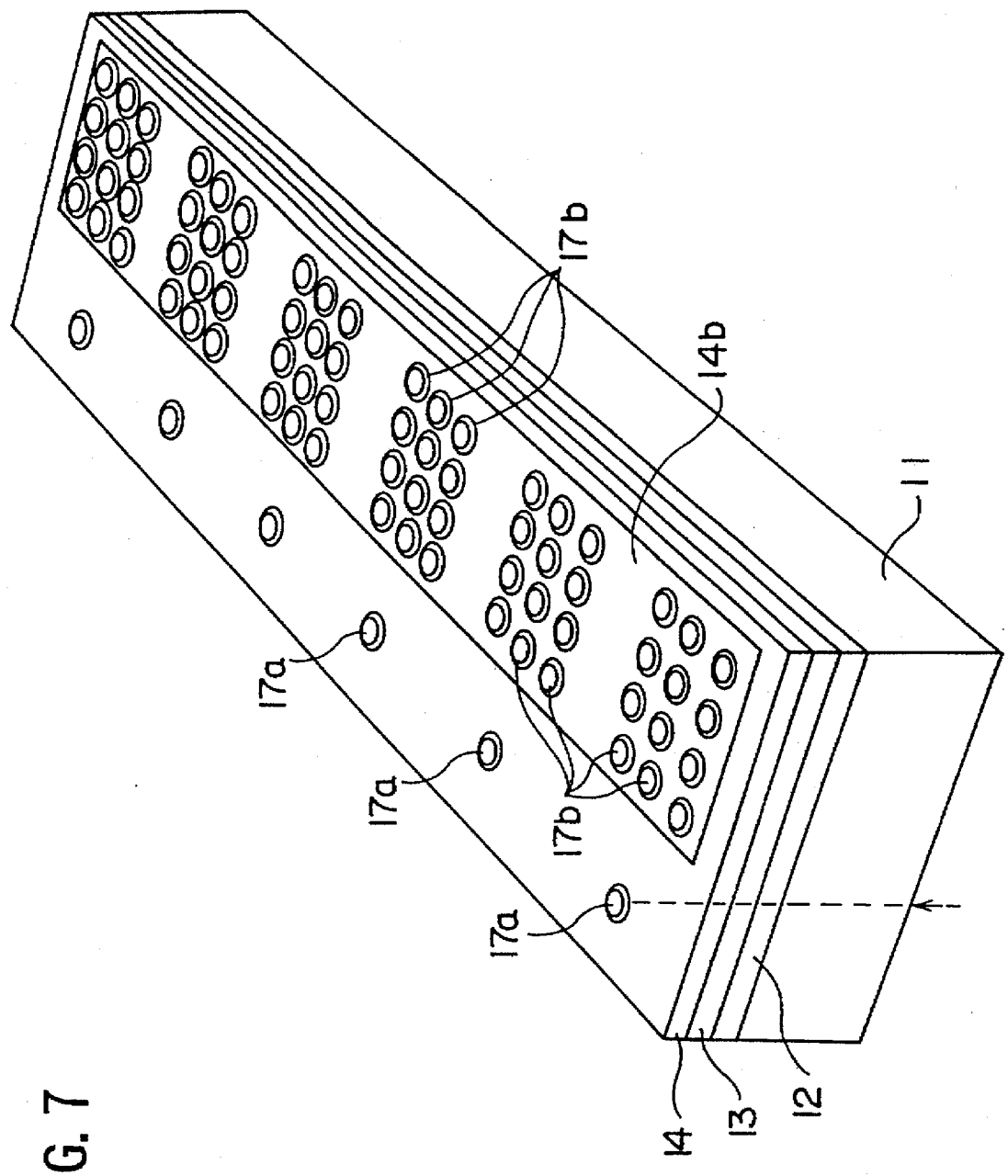
FIG. 7 is a diagram showing a photodetection integrated circuit formed of the semiconductor photodetection device of the second embodiment in a perspective view.

FIG. 7 shows a construction in which a plurality of photodetection devices, each having a construction of FIGS. 6A and 6B, are provided commonly on the substrate 11 to form an optical integrated circuit, wherein those parts corresponding to the parts described previously are designated by the same reference numerals and the description thereof will be omitted.

Referring to FIG. 7, each of the photodetection devices receives an optical signal that is supplied thereto via an optical fiber (not illustrated), wherein the optical signal enters the photodetection device from a downward direction as indicated in FIG. 7 by a broken line. In correspondence to each of the photodiodes, one may provide a microlens on the lower major surface of the substrate 11 to form a microlens array. In the illustrated example, the diffusion region 14b is formed commonly to all of the photodetection devices on the substrate 11.

Figure 8:
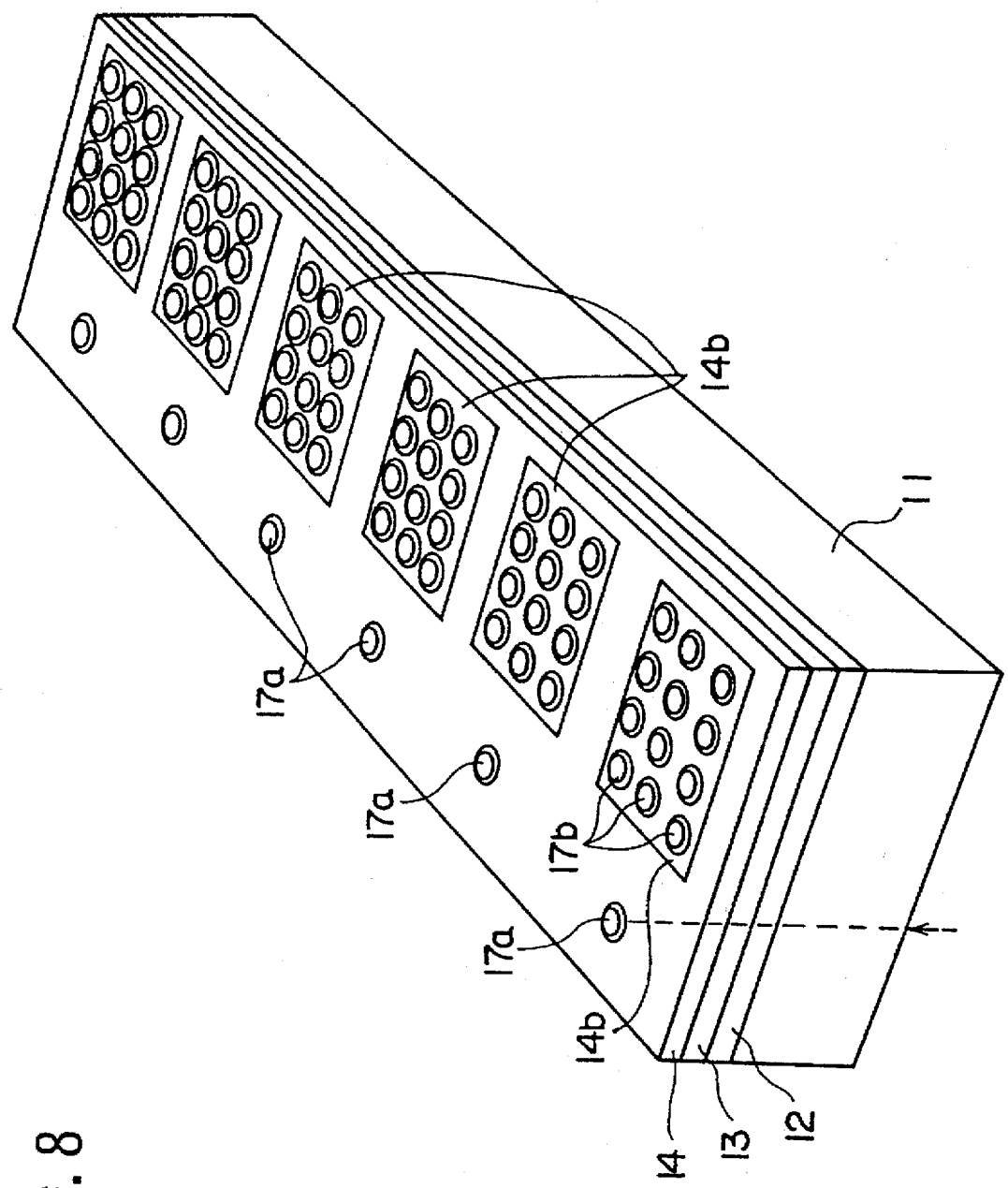
FIG. 8 is a diagram showing a modification of the photodetection integrated circuit of FIG. 7.

FIG. 8 shows a modification of the semiconductor photodetection integrated circuit of FIG. 7.

In FIG. 8, it will be noted that the diffusion region 14b for the drive diode is divided into plural, separate regions each corresponding to a photodetection device, rather than forming the diffusion region commonly for all of the photodetection devices. By separating the individual diffusion regions 14b as such, it is possible to suppress the problem of interference between individual photodetection devices such as cross-talk.

Figure 9:
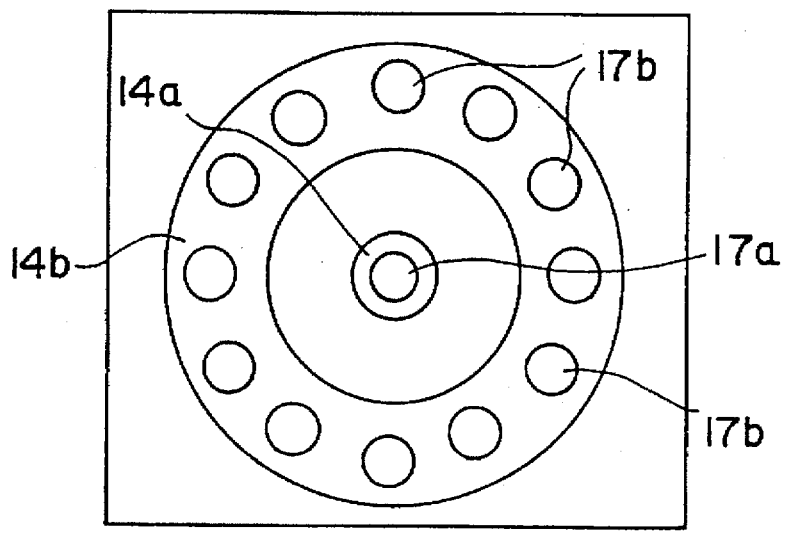
FIG. 9 is a diagram showing a modification of the semiconductor photodetection device of the second embodiment of the present invention.

FIG. 9 shows another modification of the photodetection device of FIGS. 6A and 6B.

Referring to FIG. 9 showing the device in a plan view, the diffusion region 14b forms a ring-shaped band surrounding the central diffusion region 14a, and the diffusion region 14b carries thereon the metal bump elements 17b in the state that the metal bump elements 17b are separated from each other. In such a construction, it should be noted that the conductive diffusion region 14b continuously surrounds the diffusion region 14a of the photodiode. Thereby, the diffusion region 14a is electrically shielded, and one can eliminate noise or any other electric interference from the output electrical signal of the photodiode.

Figure 10:
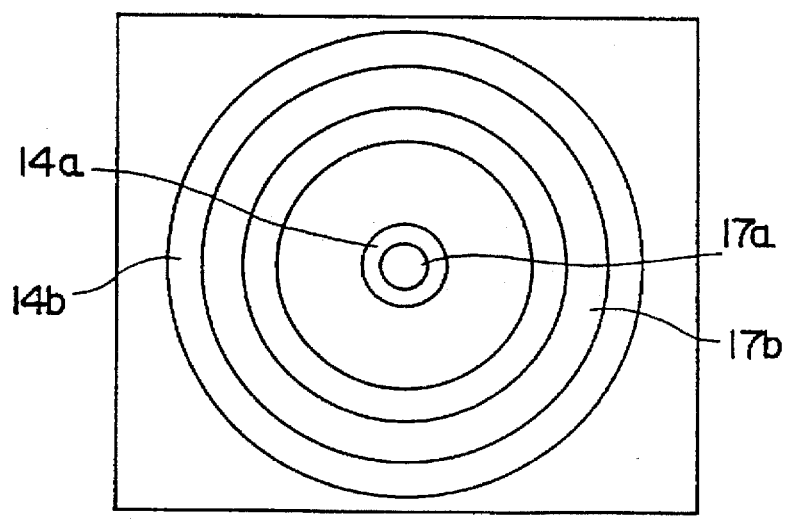
FIG. 10 is a diagram showing the construction of a semiconductor photodetection device according to a third embodiment of the present invention.

FIG. 10 shows the construction of the semiconductor photodetection device according to a third embodiment of the present invention, wherein those parts described previously are designated by the same reference numerals and the description thereof will be omitted. The embodiment of FIG. 10 may be regarded as a modification of the first embodiment described with reference to FIGS. 4A and 4B. Alternatively, the embodiment may be regarded as a modification of the construction of FIG. 9.

Referring to FIG. 10 showing the photodetection device in a plan view, it will be noted that the diffusion region 14b forms a ring-shaped band surrounding the central diffusion region 14a similarly as in the embodiment of FIG. 9. In the present embodiment, the diffusion region 14b carries thereon the metal bump 17b that now forms a continuous, ring-shaped band corresponding to the diffusion region 14b. In other words, the metal bump 17b surrounds the metal bump 17a continuously. Thereby, the metal bump 17b has an area at least ten times as large as the metal bump 17a.

By constructing the photodetection device as in FIG. 10, it will be noted that most of the load applied to the photodetection device is supported by the ring-shaped metal bump 17b, and the central metal bump 17a is kept substantially free from external stress. Further, the metal bump 17b creates an air-tight environment when soldered upon a corresponding wiring pattern on a support substrate, and the central metal bump 17a is protected in such an air-tight environment. Further, the metal bump 17b provides an effective electromagnetic shielding upon the central metal bump 17a, similarly to the previous embodiment.

Figure 11:
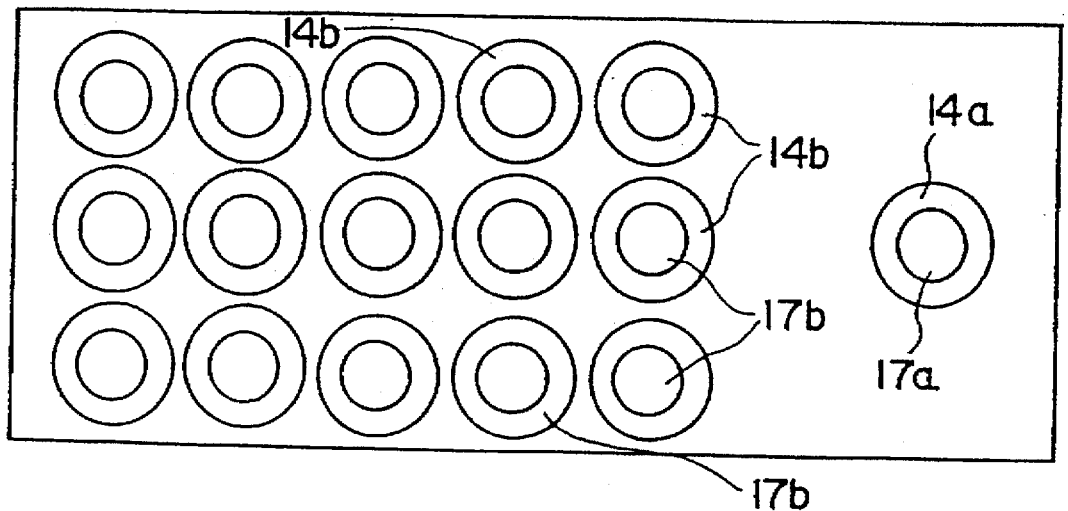
FIG. 11 is a diagram showing the construction of a semiconductor photodetection device according to a fourth embodiment of the present invention.

FIG. 11 shows a semiconductor photodetection device according to a fourth embodiment of the present invention in a plan view, wherein those parts described previously are designated by the same reference numerals and the description thereof will be omitted. The present embodiment may be regarded as a modification of the device of the second embodiment described previously with reference to FIGS. 6A and 6B.

Referring to FIG. 11, the photodetection device of the present embodiment includes a drive diode that in turn is formed of a number of elemental diffusion regions 14b each having a size and shape substantially identical to those of the diffusion region 14a, wherein the diffusion region 14a carries thereon the metal bump 17a similarly as before. Further, each of the elemental diffusion regions 14b carries thereon a metal bump 17b, wherein the metal bump 17b has a size and shape substantially identical with those of the metal bump 17a.

As will be noted in the plan view of FIG. 11, the elemental diffusion regions 14b as well as the corresponding metal bumps 17b are arranged in rows and columns on the layered semiconductor body provided on the substrate 11, wherein the layered semiconductor body includes the semiconductor layers 12–14 similarly as before. Thereby, the total area of the metal bumps 17b is at least ten times as large as the metal bump 17a, and the photodetection device is supported on the support substrate primarily by the metal bumps 17b. Thus, similarly to the embodiments described previously, no substantial stress is transmitted to the diffusion region 14a via the metal bump 17a.

In the construction of FIG. 11, it should further be noted that each of the elemental diffusion regions 14b forms a single, independent diode. Thus, any of the diodes can be used as a photodiode.

Figure 12:
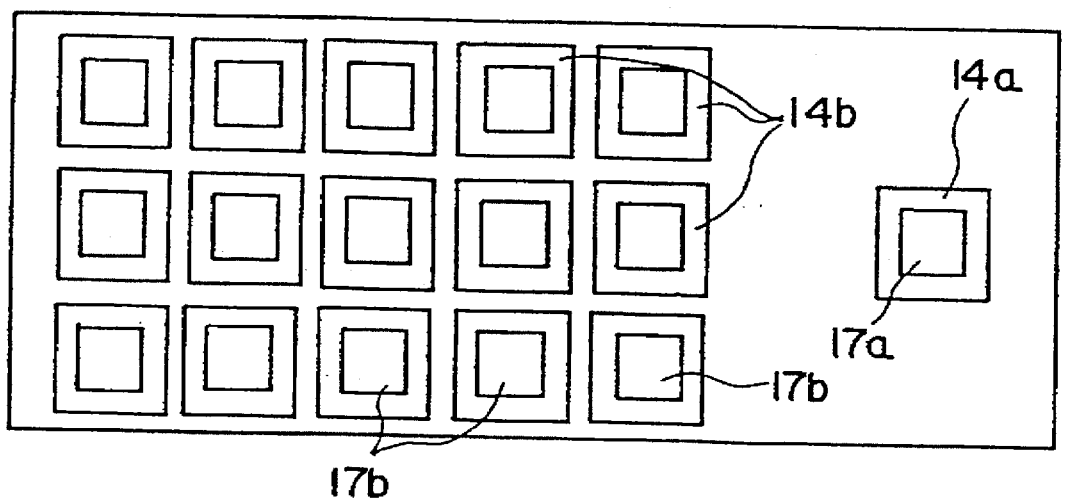
FIG. 12 is a diagram showing a modification of the semiconductor photodetection device of FIG. 11.

FIG. 12 shows a modification of the semiconductor photodetection device of FIG. 11.

Referring to FIG. 12, each of the diffusion region 14a and the elemental diffusion regions 14b has a rectangular shape rather than circular shape contrary to the embodiment of FIG. 11, and the metal bums 17a and 17b also have a corresponding rectangular shape. By construction the photodetection device as such, it is possible to reduce the separation between adjacent elemental diffusion regions 14b.

Figure 13:
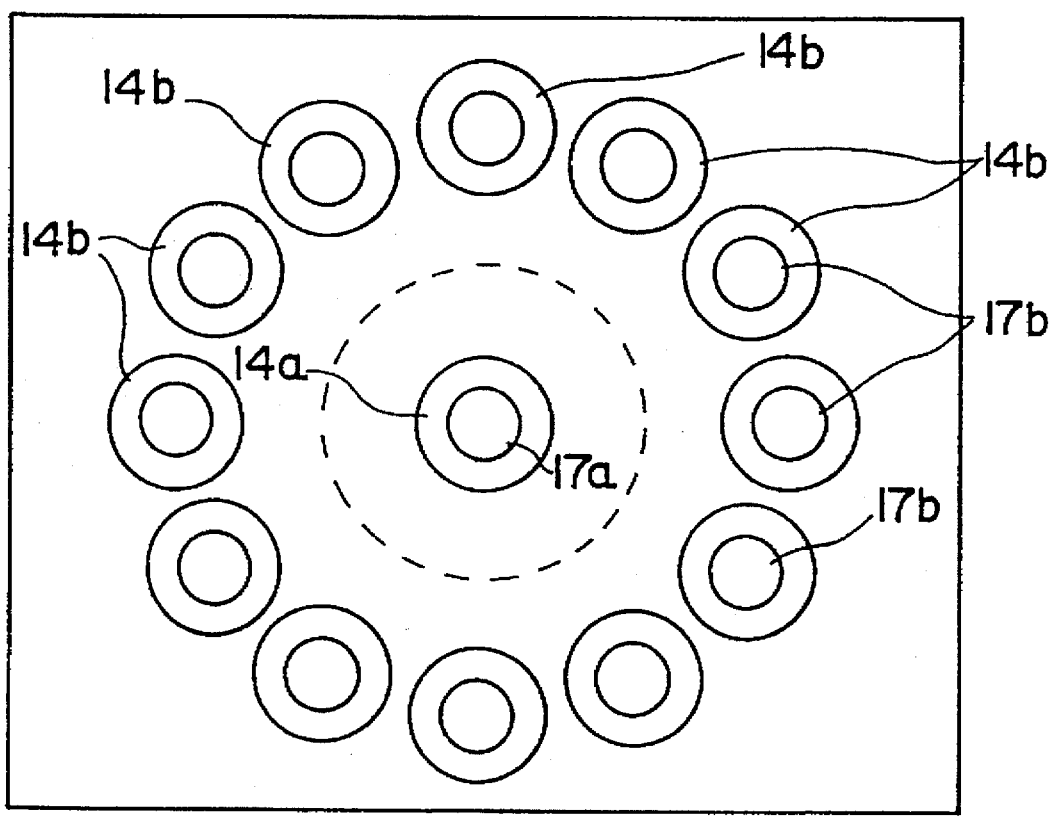
FIG. 13 is a diagram showing another modification of the semiconductor photodetection device of FIG. 11.

FIG. 13 shows a further modification of the embodiment of FIG. 11.

In the present embodiment, the diffusion region 14a forming the photodiode is provided at a central part of the semiconductor layered body when viewed in a plan view, and the elemental diffusion regions 14b are disposed so as to surround the diffusion region 14a. In other words, the elemental diffusion regions 14b are disposed outside an optical fiber that is connected to the central diffusion region 14a as indicated in FIG. 13 by a broken line. Thereby, the optical signal transmitted via the optical fiber is supplied selectively to the photodiode provided by the diffusion region 14a, and the problem of the drive diode, formed of the diffusion region 14b, acting unwantedly as a photodiode is effectively eliminated.

Figure 14:
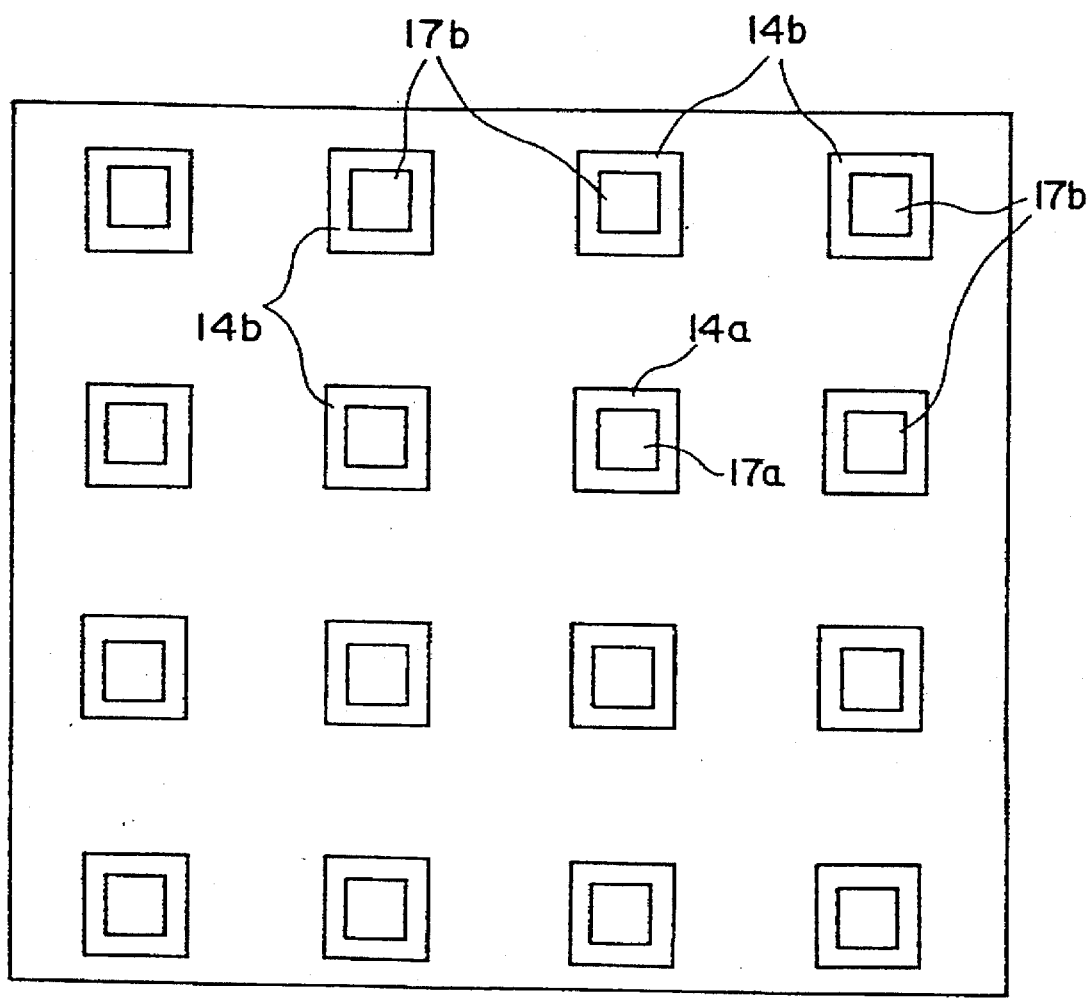
FIG. 14 is a diagram showing a further modification of the semiconductor photodetection device of FIG. 11.

FIG. 14 shows a further modification of the photodetection device of FIG. 11.

In the present modification, a number of diffusion regions each having identical size and shape are disposed on the layered semiconductor body in a row and column formation. In such a structure, an arbitrarily selected diffusion region is used for the diffusion region 14a that forms the photodiode, while the rest of the diffusion regions are used for the diffusion region 14b. Further, each of the diffusion regions on the layered semiconductor body carries a metal bump, and the metal bump that is provided on the diffusion region selected for the diffusion region 14a, acts as the metal bump 17a. The rest of the metal bumps act as the metal bump 17b.

According to the construction as set forth above, it will be noted that each of the diffusion regions as well as the corresponding metal bumps thereon, is equivalent with each other. Thus, one can choose any of the diffusion regions for the photodiode by supplying an optical signal to the selected diffusion region. Thereby, the photodetection device of the present embodiment can form an optically controlled processor by selectively supplying optical signals to one or more photodiodes thus formed. In the present embodiment, too, it should be noted that the mechanical load applied to the photodetection device is distributed to the metal bumps and the concentration of mechanical stress to a particular diffusion region is avoided.

Figure 15:
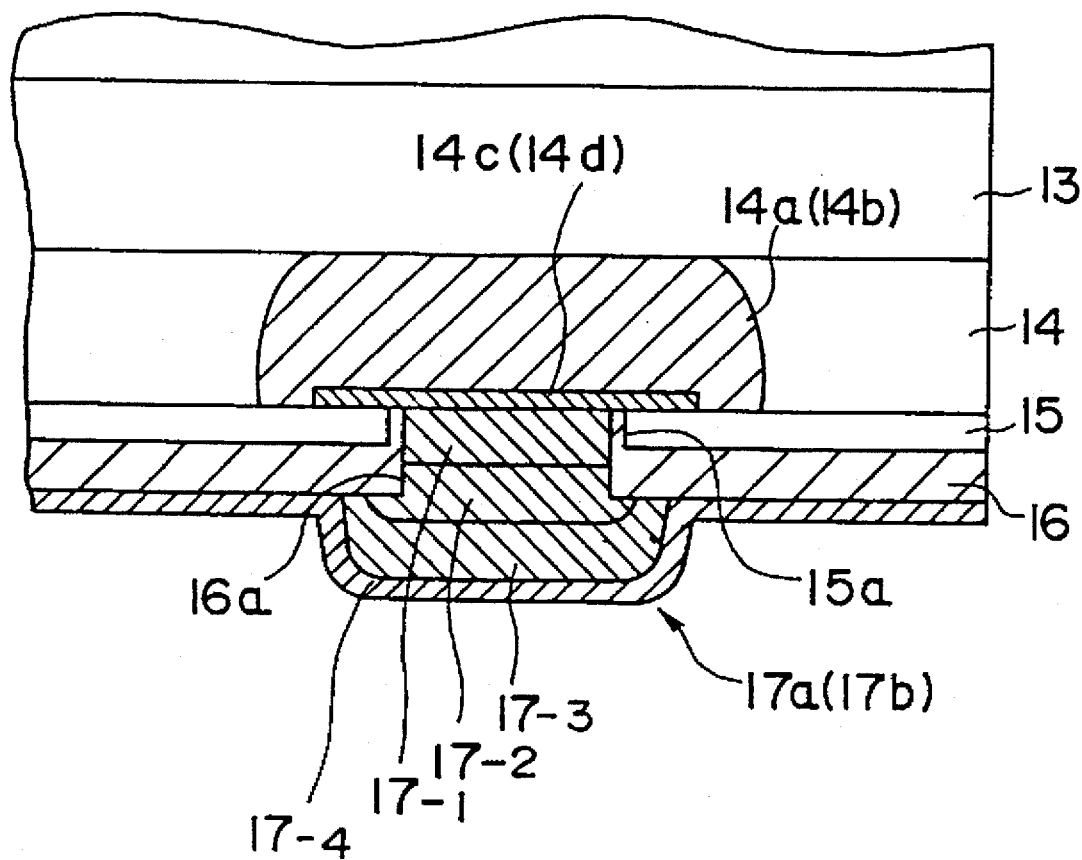
FIG. 15 is a diagram showing the construction of a metal bump used conventionally in a semiconductor photodetection device.

FIG. 15 shows the details of the metal bumps 17a and 17b used in the various embodiments described previously. As the structural feature of the metal bumps is substantially identical in the metal bump 17a and in the metal bump 17b, only the metal bump 17a will be explained hereinafter.

Figure 16:
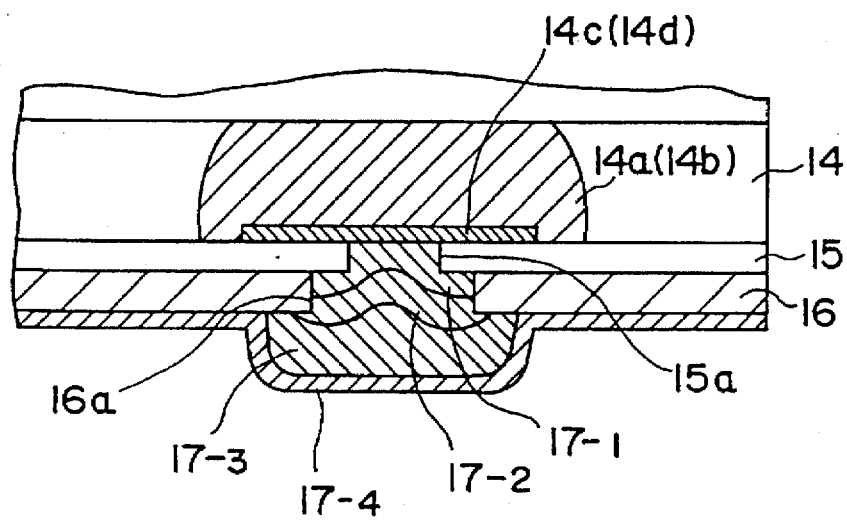
FIG. 16 is diagram showing the construction of a metal bump of a semiconductor photodetection device according to a fifth embodiment of the present invention.

Referring to FIG. 16, the metal bump 17a is formed in correspondence to the contact holes 15a and 16a and includes a first conductor layer $17_1$ of a refractory metal such as Pt, Pd, Rh, Cu or Au wherein the conductor layer $17_1$ is provided on the ohmic electrode 14c that covers the diffusion region 14a. On the first conductor layer $17_1$, a second conductor layer $17_2$ of Au or Cu is formed, and a third conductor layer of a low-melting metal such as Sn is provided on the second conductor layer $17_2$. Further, a flux layer $17_4$ covers the third conductor layer $17_3$. Upon flip-chip mounting on a support substrate, the third conductor layer $17_3$ experiences a fusion and establishes an electrical as well as mechanical bonding with a conductor pattern on the support substrate. The refractory metal layer $17_1$ thereby acts to prevent the molten metal of the conductor layer $17_3$ from reaching the ohmic electrode 14c and penetrating further into the diffusion region 14a. The second conductor layer $17_2$, on the other hand, acts as a usual pad electrode and supports the third conductor layer $17_3$ that acts as a solder layer.

It should be noted that such a conventional metal bump can be formed by depositing respective conductor layers, followed by a lift-off process. The metal bumps, however, can be formed also by an electroplating process as will be described later. When an electroplating process is employed, the conductor layers $17_1$–$17_3$ are grown selectively in correspondence to the contact holes 15a and 16a, without any patterning processes. Thus, one can avoid the problem pertinent to the patterning process that valuable electrode materials such as Au, Pt, Pd or Rh are wasted.

In the construction of FIG. 15, on the other hand, there is a problem, due to the construction in which the refractory conductor layer $17_1$ is provided inside the contact hole 16a that in turn is located inside the contact hole 15a, in that a molten solder alloy forming the conductor layer $17_3$ may reach the ohmic electrode 14c once a crack develops between the inner wall of the contact hole 16a and the conductor layer $17_1$.

FIG. 16 shows the construction of the metal bump that eliminates the foregoing problem, wherein the construction of FIG. 16 forms a fifth embodiment of the present invention.

Referring to FIG. 16, the present embodiment has a construction in which the contact hole 15a provided in the insulation layer 15 of SiN or $SiO_2$ has a diameter set smaller than that of the contact hole 16a that is formed on the polyimide layer 16. As a result, the insulation layer 15 extends inwardly in the contact hole 16a, and there is formed a step between the side wall of the contact hole 15a and the side wall of the contact hole 16a.

In the present embodiment, it should be noted that the first conductor layer $17_1$ is formed to cover or bury the stepped past of the insulation layer 15 that is located inside the contact hole 16a. In such a structure, the penetration of the molten solder alloy into the diffusion region 14c is positively prevented even when a crack has developed between the inner wall of the contact hole 16a and the first conductor layer $17_1$.

In the construction of FIG. 16, it should be noted further that the conductor layer $17_3$ not only fills the contact hole 16a but also the insulation layer 16 in correspondence to the peripheral part of the contact hole 16a. Thus, the contact structure is effective also for preventing the molten solder alloy to reach the conductor layer $17_1$ even when a crack has developed between the inner wall of the contact hole 16a and the conductor layer $17_2$.

Figure 17:
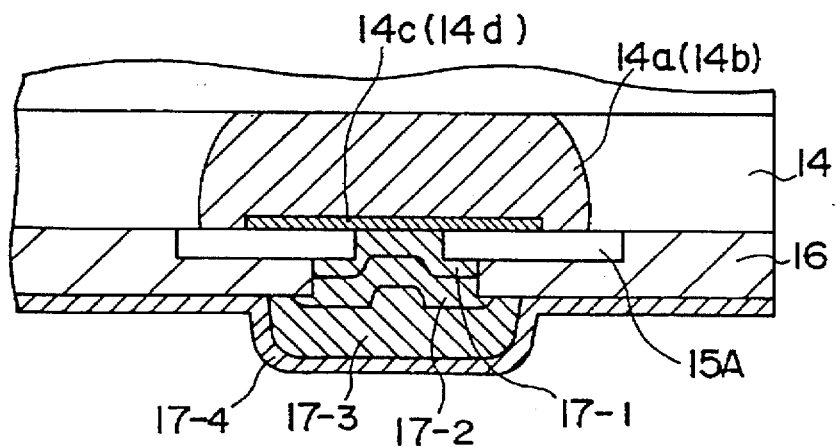
FIG. 17 is a diagram showing a modification of the metal bump of FIG. 16.

FIG. 17 shows a modification of the metal bump structure of FIG. 17.

Referring to FIG. 17, the structure of FIG. 17 uses a SiN pattern 15A in place of the SiN layer 15, wherein the SiN pattern 15A is patterned to cover only the diffusion region 14a. By providing the SiN pattern 15A selectively on the diffusion region 14a, it is possible to reduce the stress between the SiN layer 15 and the semiconductor layer 14.

Next, an improved metal bump structure of in a semiconductor optical detection device will be described with reference to FIG. 18 as a sixth embodiment of the present invention, wherein those parts described previously are designated by the same reference numerals and the description thereof will be omitted.

As described already, the mechanical stress applied the diffusion region of a photodiode causes various problems such as increased dark current, deterioration of operational characteristics, and the like. Thus, the present embodiment forms a depressed region in the metal bump in correspondence to the diffusion region, such that the mechanical stress applied to the diffusion region at the time of flip-chip mounting of the photodetection device is minimized.

Figure 18:
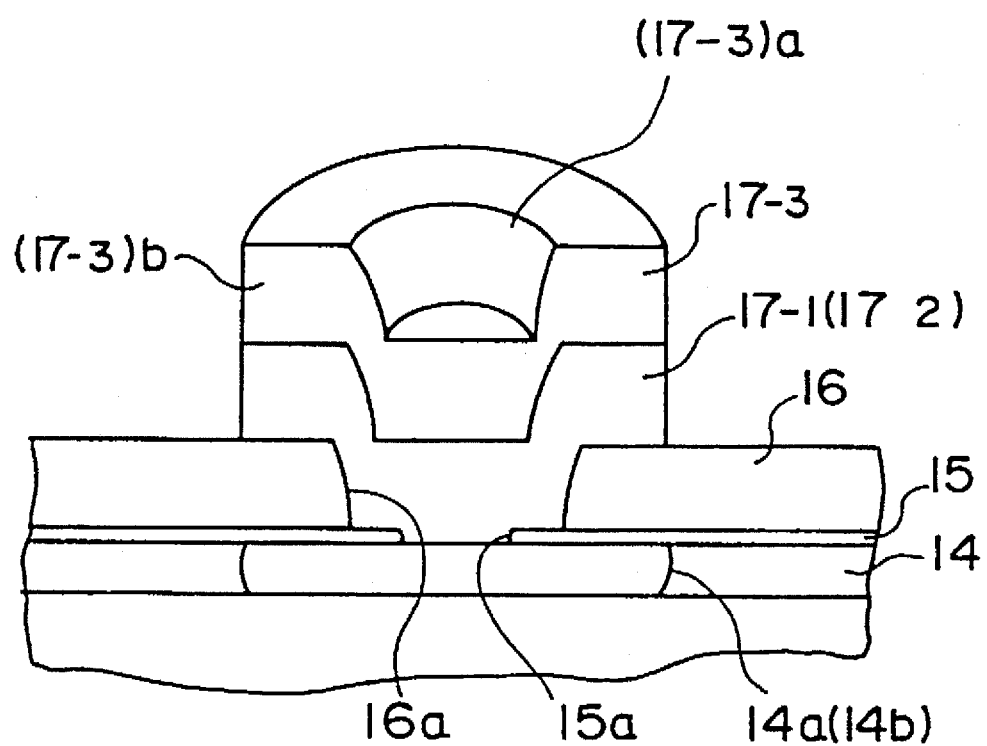
FIG. 18 is a diagram showing the construction of a metal bump of a semiconductor photodetection device according to a sixth embodiment of the present invention.

Referring to FIG. 18, it will be noted that the metal bump is formed on the polyimide layer 16, similarly as before, in which the polyimide layer is set to have a relatively large thickness of about 3–4 μm. Further, the conductor layer $17_1$ is provided so as to cover the contact hole 16a, wherein the conductor layer $17_1$ thus formed includes a central depression in correspondence to the contact hole 16a. In the example of FIG. 18, the conductor layer $17_1$ includes also the conductor layer $17_2$ of FIG. 16 or FIG. 17. Further, the conductor layer $17_3$ is deposited upon the conductor layer $17_1$, wherein the conductor layer $17_3$ thus formed has a central depression $(17_3)_a$ corresponding to the central depression of the conductor layer $17_1$ such that the central depression $(17_3)_a$ is surrounded by a side wall $(17_3)_b$. When mounting the photodetection device upon a support substrate, the side wall $(17_3)_b$ of the metal bump collapses as a result of melting, and no substantial stress is transmitted to the underlying diffusion region 14a or 14b.

FIGS. 19A–19F show the process of forming the metal bump of FIG. 18. In the description below, explanation will be given only for the case of forming the metal bump 17a on the diffusion region 14a, while it should be noted that a similar process is applicable also for the formation of the metal bump 17b on the diffusion region 14b.

Figure 19A:
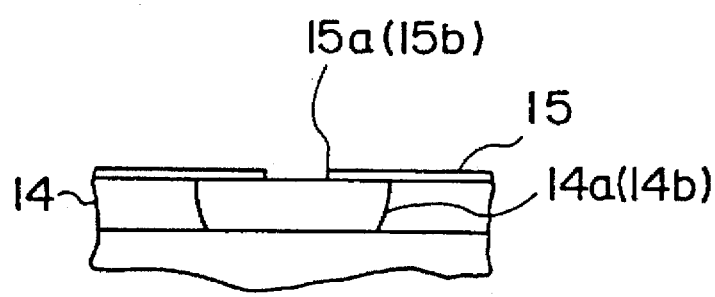
FIGS. 19A–19F are diagrams showing the fabrication process of the metal bump of FIG. 18.
Figure 19B:
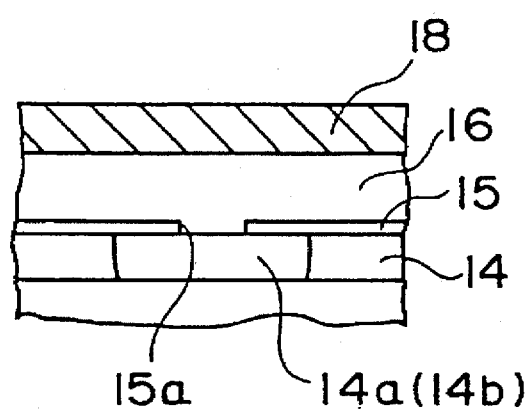

Referring to FIG. 19A, the SiN layer 15 is deposited on the semiconductor layer 14 with a thickness of 200 nm, wherein the semiconductor layer 14 includes the diffusion region 14a of which diameter is set to about 10 μm. Further, the SiN layer 15 is formed with the opening 15a in correspondence to the central part of the diffusion region 14a with a diameter of about 10 μm. Further, the polyimide layer 16 is deposited on the SiN layer 15, and a resist layer 18 is provided further on the layer 16 as indicated in FIG. 19B.

Figure 19C:
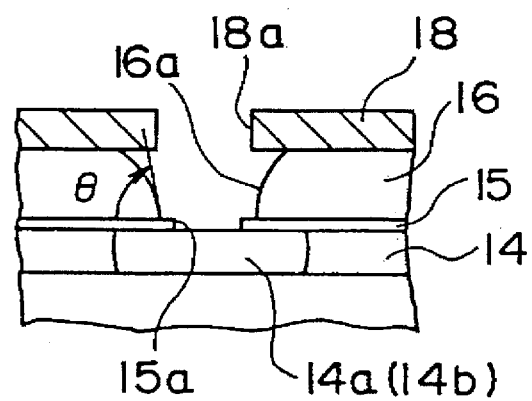

Next, in the step of FIG. 19C, the resist layer 18 is patterned photolithographically to form an opening 18a corresponding to the foregoing contact hole 15a, wherein a patterning of the polyimide layer 16 is conducted while using the resist layer 18 as a mask. As a result of the patterning, the contact hole 16a is formed in the polyimide layer 16 in correspondence to the opening 18a. It should be noted that the patterning of the polyimide layer 16 may be conducted concurrently to the development of the resist layer 18 by using the developer solution of the layer 18 as an etchant. As a result of such a patterning process, the contact hole 16a is formed to have a side wall inclined with respect to the principal surface of the semiconductor layer 14 or the insulator layer 15 by an angle Θ, wherein the angle Θ typically falls in the range of 50°–80°. After removing the resist layer 18, one obtains a structure shown in FIG. 19D.

Figure 19D:
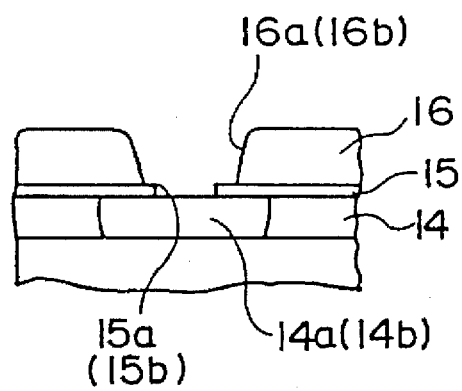
Figure 19E:
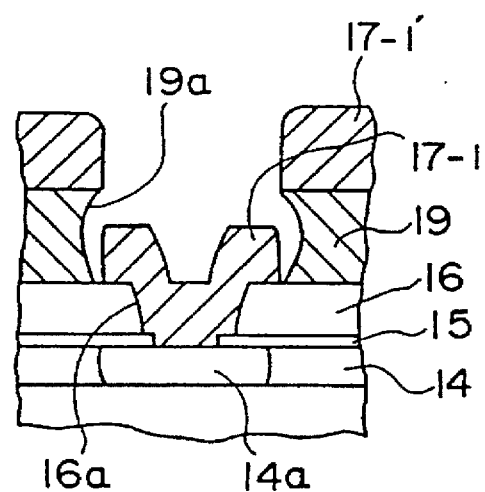
Figure 19F:
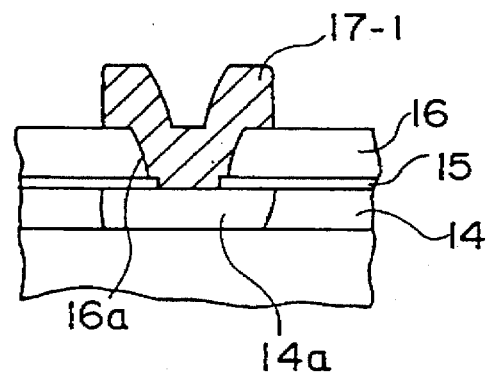

Next, in the step of FIG. 19E, another resist layer 19 is deposited on the structure of FIG. 19D. By patterning the resist layer 19 photolithographically, an opening 19a is formed in the resist layer 19 in correspondence to the contact hole 16a. Further, a refractory metal such as Au, Cu, Pt or Rh is deposited on the contact hole 16a while using the resist layer 19 as a mask. Thereby, the conductor layer $17_1$ that constitutes a part of the metal bump is formed in correspondence to the contact hole 16a. As described previously, the conductor layer $17_1$ may include the conductor layer $17_2$ described previously with reference to FIGS. 16 and 17 therein. Simultaneously to the formation of the conductor layer $17_1$, a refractory metal layer $17_1'$ is formed on the resist layer 19. Thus, by dissolving the resist layer 19 and lifting off the refractory metal layer $17_1'$, one obtains a structure shown in FIG. 19F. By forming the layer $17_3$ of Sn on the structure of FIG. 19F, the metal bump having a central depression in correspondence to the diffusion region 14a is obtained. It should be noted that the deposition of the layer $17_3$ may be conducted by an electroplating process.

Figure 20:
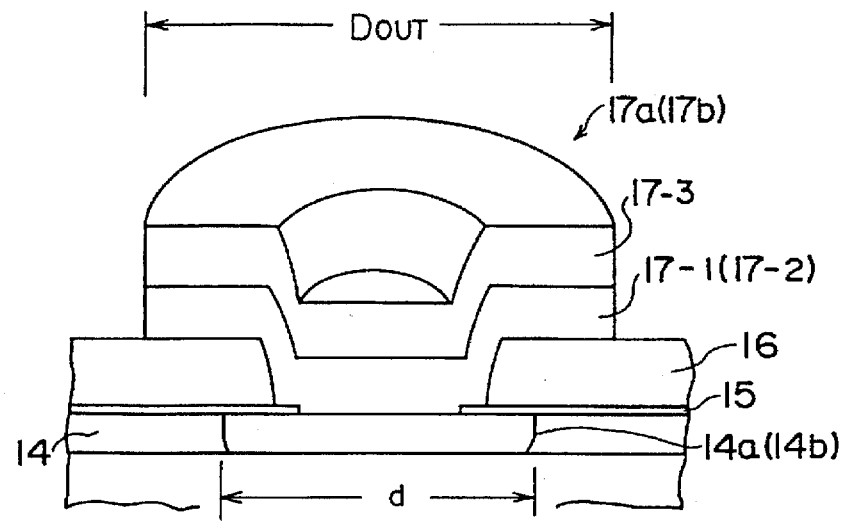
FIG. 20 is a diagram showing a modification of the metal bump of FIG. 18.

FIG. 20 shows a modification of the metal bump shown in FIG. 18. In the example of FIG. 20, it will be noted that the outer diameter $D_{OUT}$ of the metal bump 17a or 17b is set larger than the size d of the diffusion region 14a or 14b. As a result of such a construction, any mechanical load applied to the metal bump at the time of mounting is transmitted primarily to the part of the semiconductor layer 14 located outside the diffusion region 14a or 14b.

Figure 21:
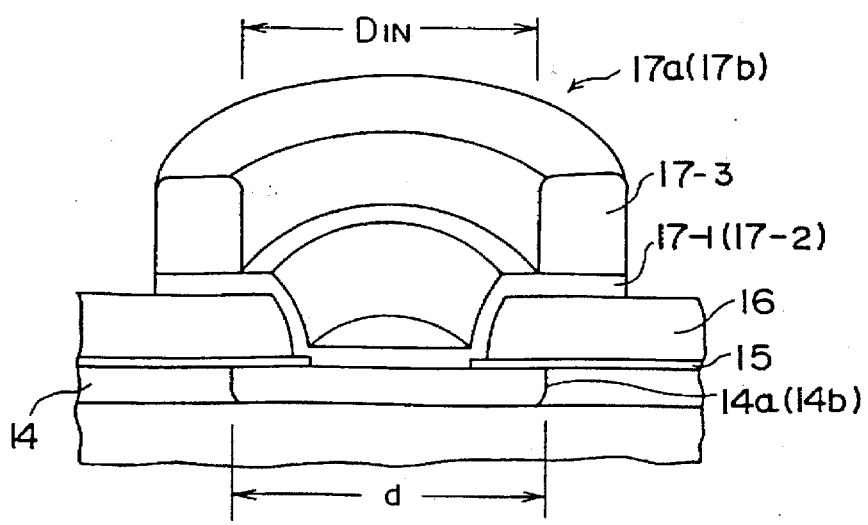
FIG. 21 is a diagram showing another modification of the metal bump of FIG. 18.

FIG. 21 shows a further modification of the metal bump of FIG. 20. In the construction of FIG. 21, the inner diameter $D_{IN}$ of the central depression formed in the metal bump 17a or 17b is set comparable to the size d of the diffusion region 14a or 14b. As a result, any mechanical load applied to the metal bump at the time of mounting the device is transmitted solely to the region of the semiconductor layer located outside the diffusion region 14a or 14b, and the diffusion region 14a or 14b is protected from stress.

Figure 22:
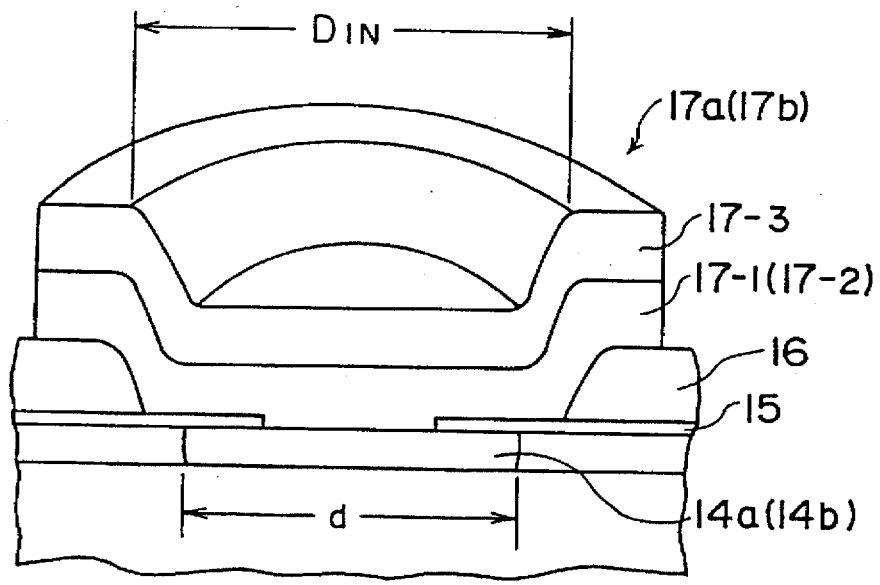
FIG. 22 is a diagram showing a further modification of the metal bump of FIG. 18.

FIG. 22 shows a further modification of the metal bump of FIG. 21. In the construction of FIG. 22, it will be noted that the inner diameter $D_{IN}$ of the central depression is set substantially larger than the size d of the diffusion region 14a or 14b. As a result, the load at the time of mounting the device is sustained solely by the region outside the diffusion region 14a or 14b similarly as in the case of FIG. 22, and the problem of deterioration of the photodiode characteristics due to the stress applied to the diffusion region is positively avoided.

Figure 23:
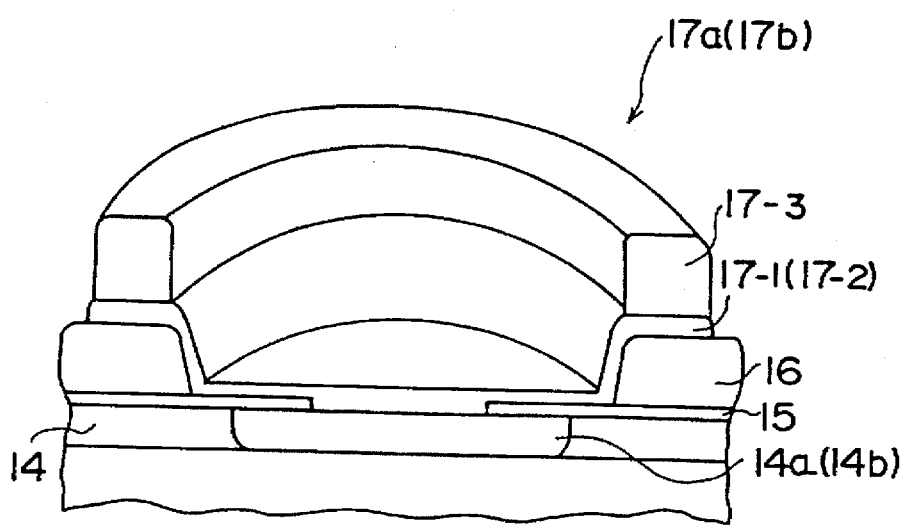
FIG. 23 is a diagram showing still other modification of the metal bump of FIG. 18.
Figure 24:
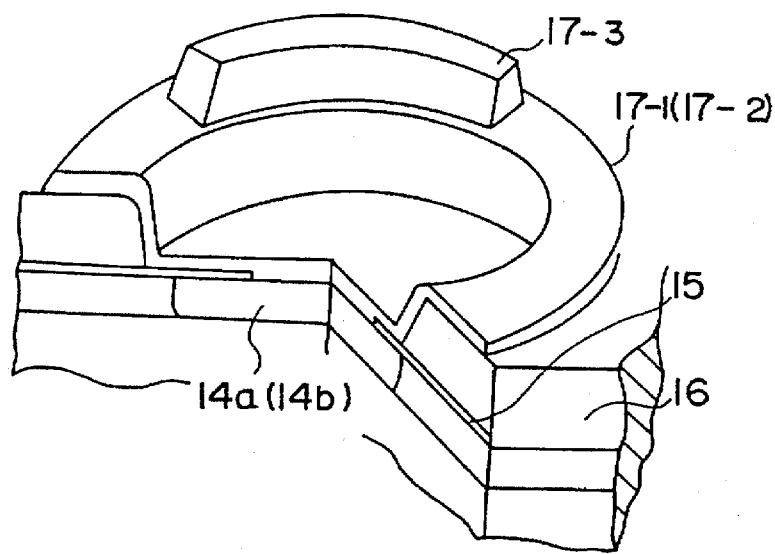
FIG. 24 is a diagram showing still other modification of the metal bump of FIG. 18.

Further, the metal bump of FIG. 22 may be modified as indicated in FIG. 23 in which the conductor layers $17_1$ and $17_3$ form a ring structure that surrounds the diffusion region 14a or 14b. Further, one may form the conductor layer $17_3$ only on a part of the underlying conductor layer $17_1$ or $17_2$ to form an arc as indicated in FIG. 24.

Figure 25:
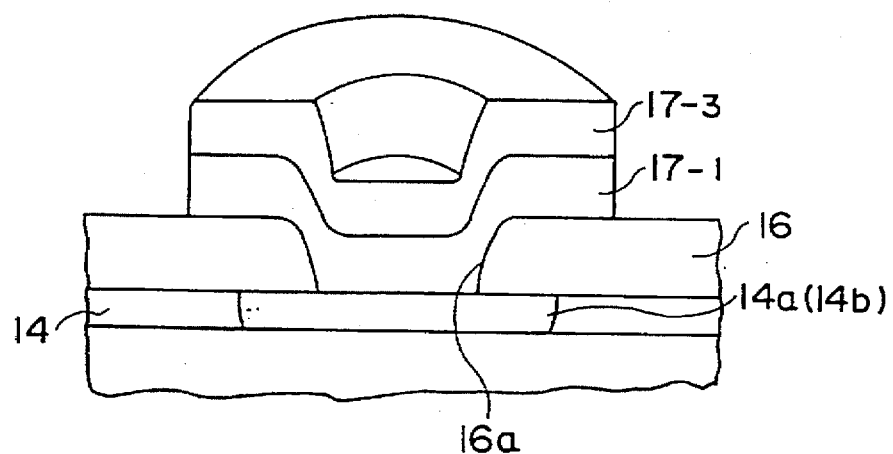
FIG. 25 is a diagram showing still other modification of the metal bump of FIG. 18.

FIG. 25 shows a further modification of the metal bump of FIG. 18. In the modification of FIG. 25, the SiN layer 15 is eliminated and the polyimide layer 16 is formed directly on the semiconductor layer 14. In such a structure, one can eliminate the process of depositing the SiN layer 15 and forming an opening 15a or 15b on such a SiN layer 15.

Figure 26:
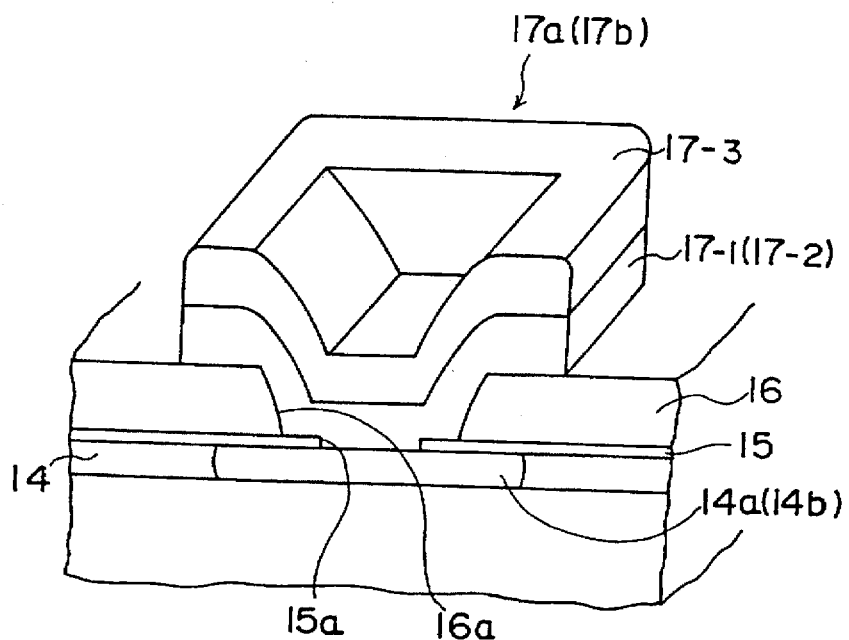
FIG. 26 is a diagram showing still other modification of the metal bump of FIG. 18.

FIG. 26 shows a still further modification of the metal bump of FIG. 18 wherein the contact holes 15a and 16a are formed to have a rectangular shape, and the conductor layers $17_1$ and $17_3$ are formed also in a corresponding rectangular shape. In such a structure, too, it is possible to eliminate the stress from the diffusion regions 14a and 14b of the diode.

Figure 27:
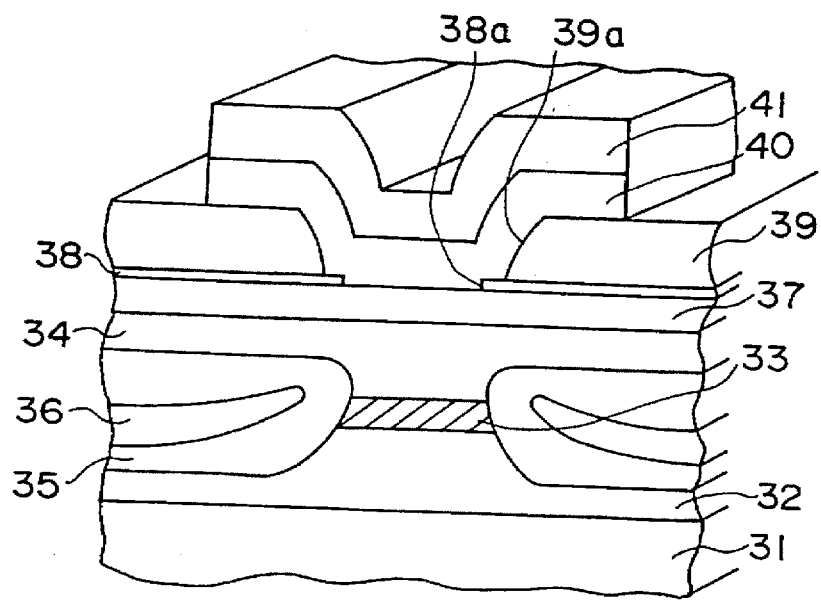
FIG. 27 is a diagram showing an example in which the metal bump of FIG. 26 is applied to an edge-emission type laser diode.

It should be noted that the rectangular metal bump of FIG. 26 is not only useful in the planar semiconductor optical detection device but also in the laser diode of edge emission type shown in FIG. 27.

Referring to FIG. 27, the edge emission type laser diode includes an n-type cladding layer 32 formed on the n-type substrate 31 and an undoped active layer 33 formed on the cladding layer 32, wherein the active layer 33 carries further thereon a p-type cladding layer 34. The active layer 33 extends in the longitudinal direction of the laser diode and is laterally confined by a pair of current confinement structures each including a p-type region 35 and an n-type region 36. Further, a p-type contact layer 37 is formed on the layer 34, and the contact layer 37 carries thereon a SiN layer 38, wherein the SiN layer 38 includes an elongated rectangular aperture 38a that extends in the longitudinal direction of the laser diode. It should be noted that the SiN layer 38 corresponds to the layer 15 described before, and carries thereon a polyimide layer 39 that corresponds to the polyimide layer 16. Further, the polyimide layer 39 includes an elongating opening 39a extending in correspondence to the elongated rectangular aperture 38a, wherein the opening 39a surrounds the aperture 38a from outside when viewed from the upward direction of the laser diode. On the polyimide layer 39, conductor patterns 40 and 41 each having a rectangular shape and corresponding to the conductor layers $17_1$ and $17_3$, are deposited consecutively so as to fill the contact holes 38a and 39a.

By configuring the laser diode as indicated in FIG. 27, it is possible to avoid excessive stress applied to the active layer 33 at the time of mounting the device on the support substrate.

Figure 28:
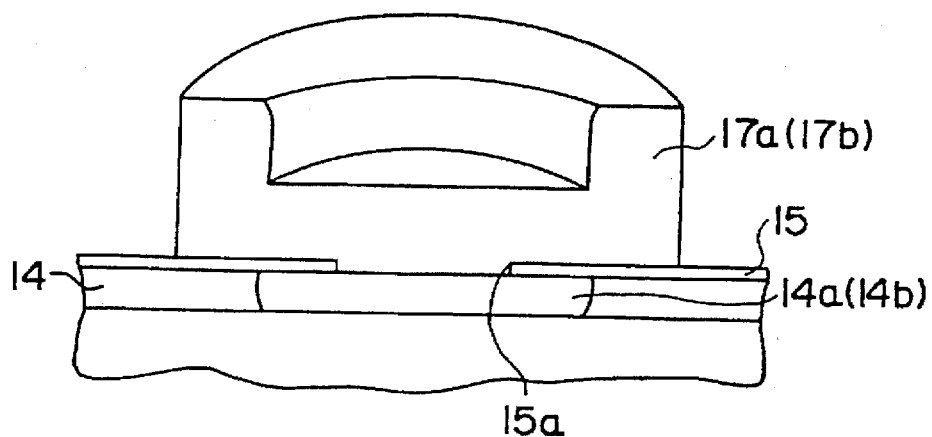
FIG. 28 is a diagram showing still other modification of the metal bump of FIG. 18.

FIG. 28 shows a construction of the metal bump structure in which the polyimide layer 16 is eliminated from the structure of FIG. 18. In such a structure that lacks the thick polyimide layer, it is not possible to form the desired central depression as long as a normal deposition process is employed. In the structure of FIG. 28, therefore, the central depression is formed in the metal bump 17a or 17b by applying an etching process after the metal bump 17a or 17b is formed.

Figure 29:
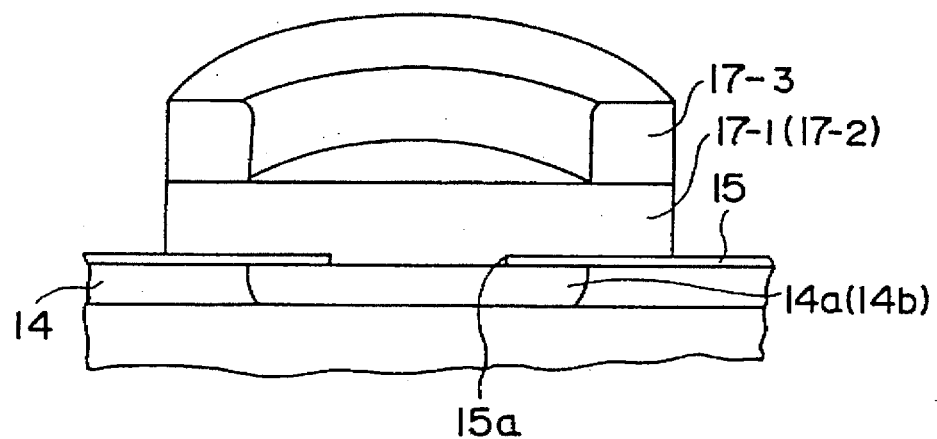
FIG. 29 is a diagram showing still other modification of the metal bump of FIG. 18.

FIG. 29 shows a modification of FIG. 28 in which the conductor layer $17_1$ is formed on the SiN layer 15 and the conductor layer $17_3$ is formed on the conductor layer $17_1$. In the embodiment of FIG. 29, the central part of the conductor layer $17_3$ is removed by an etching to form a ring-shaped bump structure.

Next, the process of forming the metal bump by an electroplating process will be described as a seventh embodiment of the present invention with reference to FIGS. 30A–30E, wherein those parts corresponding to the parts described previously are designated by the same reference numerals and the description thereof will be omitted. In the description hereinafter, only the formation of the metal bump 17a will be described, as the same process is applicable also to the formation of the metal bump 17b.

Figure 30A:
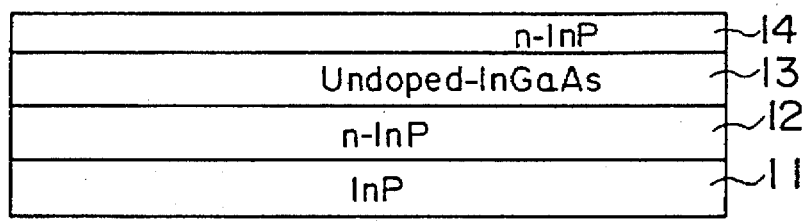
FIGS. 30A–30E are diagrams showing the process according to a seventh embodiment of the present invention for forming a metal bump on a semiconductor photodetection device by an electrodepositon process.

Referring to FIG. 30A, a layered semiconductor body is formed by consecutively depositing the InP layer 12 of the $n^+$-type, the undoped InGaAs layer 13 and the InP layer 14 of the $n^+$-type, on the InP substrate 11 of the n-type.

Figure 30B:
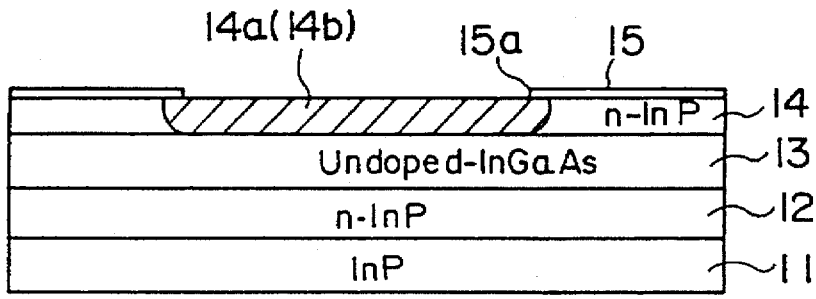

Next, in the step of FIG. 30B, the SiN film 15 is deposited on the surface of the InP layer 14 with a thickness of about 200 nm, followed by a patterning to form an aperture 15a in the SiN film 15. Further, Zn ions are introduced into the InP layer 14 by an ion implantation process or thermal diffusion process to form a diffusion region 14a in alignment with the aperture 15a. Further, in the step of FIG. 30C, the ohmic electrode 14c is provided on the surface of the diffusion region 14a, and the SiN layer 15 is patterned subsequently such that the SiN layer is removed except for the part adjacent to the diffusion region 14a.

Figure 30C:
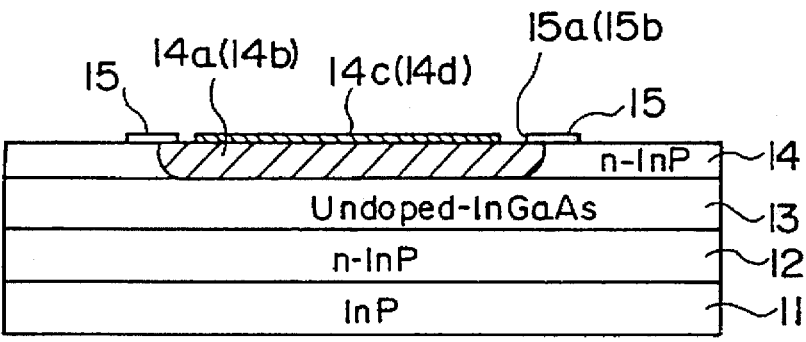
Figure 30D:
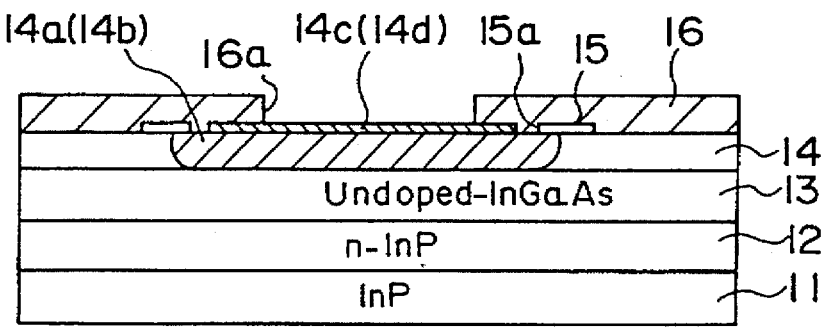

Next, in the step of FIG. 30D, a polyimide layer 16 is deposited on the InP layer 14 with a thickness of 3–4 μm so as to cover the ohmic electrode 14c as well as the SiN pattern 15, followed by a patterning process to form a contact hole 16a, such that the ohmic electrode 14c on the diffusion region 14a is exposed at the contact hole 16a. Further, in the step of FIG. 30E, an electrode 11c is formed on the lower major surface of the substrate 11, and an electrodepositon process of the electrode 17a is conducted on the exposed ohmic electrode 14c by applying a voltage to the electrode 11c.

According to the present invention, the electrode 17a grows selectively on the exposed ohmic electrode 14c, and the problem of wasting the valuable electrode material such as Au, Pt, Pd or Rh is successfully avoided.

FIGS. 31A–31E show a modification of the process of FIGS. 30A–30E.

Figure 31A:
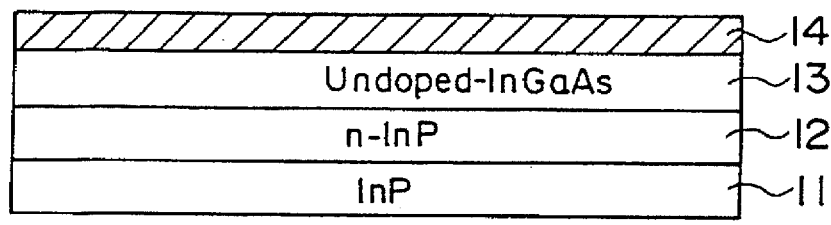
FIGS. 31A–31E are diagrams showing a modification of the process of FIGS. 30A–30E.
Figure 31B:
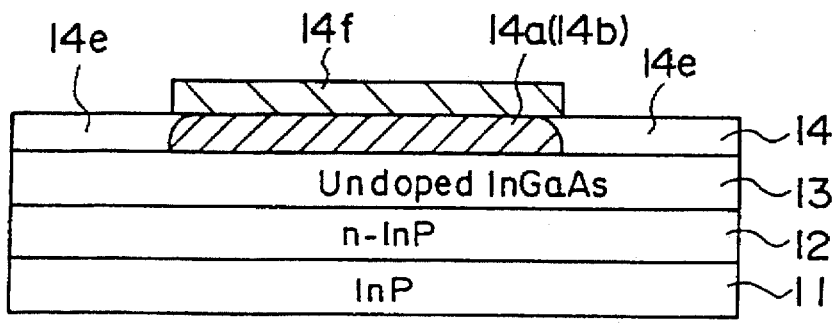
Figure 31C:
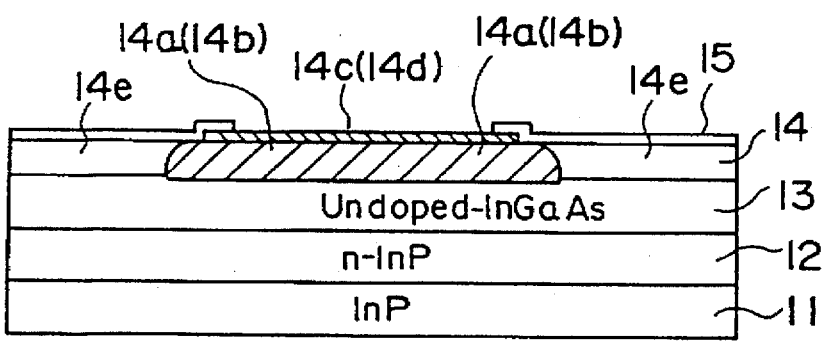
Figure 31D:
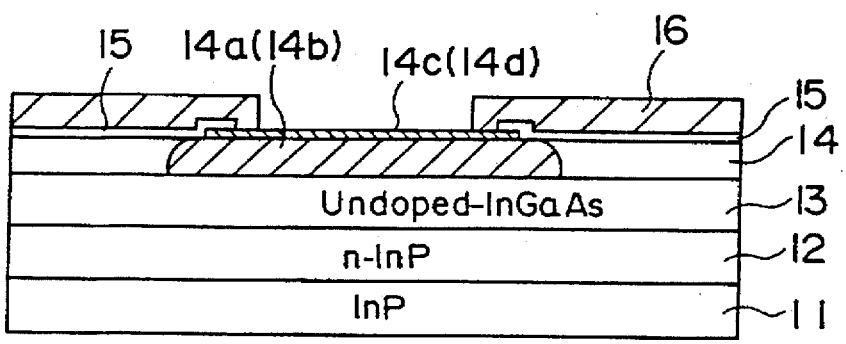
Figure 31E:
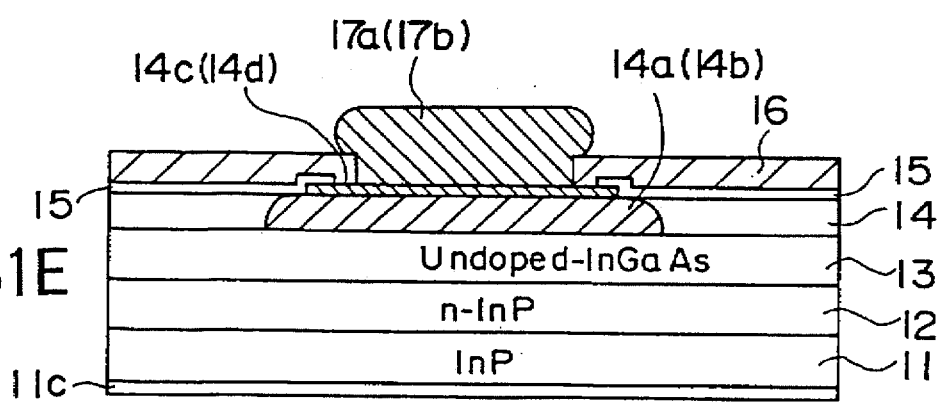

Referring to FIG. 31A, a p-type InP layer is deposited on the undoped InGaAs layer 13 as the layer 14, and an ion implantation of a deep impurity such as proton, oxygen, S or Sn is conducted into the InP layer 14 in the step of FIG. 31B while protecting the part of the layer 14 in which a diffusion region is to be formed, by a mask 14f. As a result of such an ion implantation, the semiconductor layer 14 becomes insulative at a region 14e in which the ion implantation is conducted. On the other hand, the region protected by the mask 14f maintains the n-type conductivity and forms the diffusion region 14a.

Figure 30E:
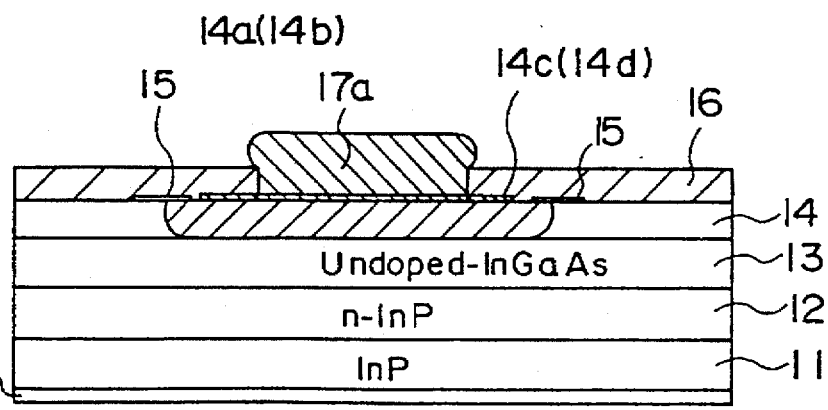

After the step of FIG. 31B, the steps identical with the steps of FIGS. 30C–30E are conducted. As will be understood from the present embodiment, the conductive region 14a is not limited to a diffusion region.

Next, the photodetection device according to an eighth embodiment of the present invention will be described with reference to FIG. 32, wherein those parts described previously are designated by the same reference numerals and the description thereof will be omitted.

Figure 32:
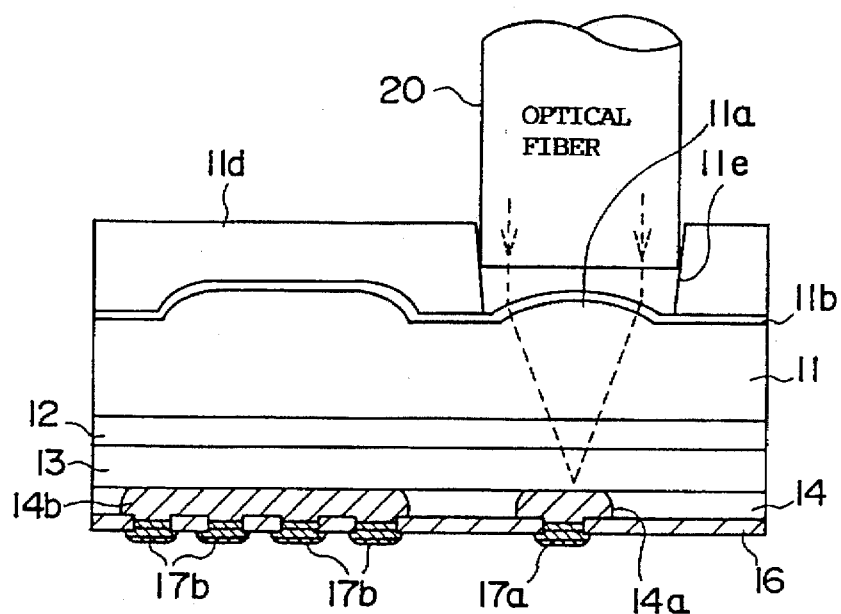
FIG. 32 is a diagram showing the construction of a semiconductor optical device according to an eighth embodiment of the present invention.

Referring to FIG. 32, a thick polyimide layer 11d is provided on the lower major surface of the substrate 11 that carries the anti-reflection film 11b, with a thickness of 50–100 μm. In the illustrated state of the device, it should be noted that the foregoing lower major surface forms an upper major surface. Further, an aperture 11e is formed in the polyimide layer 11d in correspondence to the microlens 11a, wherein the aperture 11e is formed with a size corresponding to the outer diameter of an optical fiber 20 that carries an input optical signal. Thus, by inserting the end of the optical fiber 20 into the aperture 11e and fixing therein, it is possible to construct the optical system such that the optical signal hits the diffusion region 14a of the photodiode substantially perpendicularly. It will also be noted that the photodetection device includes a plurality of metal bumps 17a in correspondence to the drive diode. In other words, the total area of the metal bumps 17a is substantially larger than the area of the metal bump 17a of the photodiode. Thus, the diffusion region 14a is maintained substantially free from external stress even when the optical fiber is connected upon the polyimide layer 11d in the state that the photodetection device is mounted upon a support substrate. Similarly, any external stress applied to the optical fiber 20 after the optical fiber 20 is connected, is not transmitted to the diffusion region 14a of the photodiode.

Figure 33:
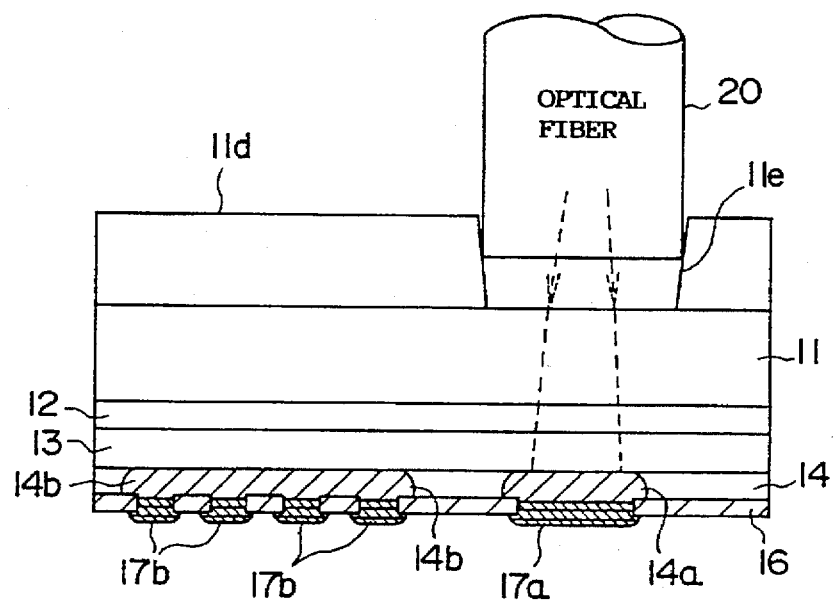
FIG. 33 is a diagram showing a modification of the semiconductor photodetection device of FIG. 32.

FIG. 33 shows a modification of the semiconductor photodetection device of FIG. 32.

In the construction of FIG. 33, it will be noted that the microlens at the rear surface of the substrate 11 shown in FIG. 32 is now removed, and instead, the diffusion region 14a is formed to have a slightly larger area in correspondence to the diffusion of the optical beam reaching the diffusion region 14a.

Figure 34:
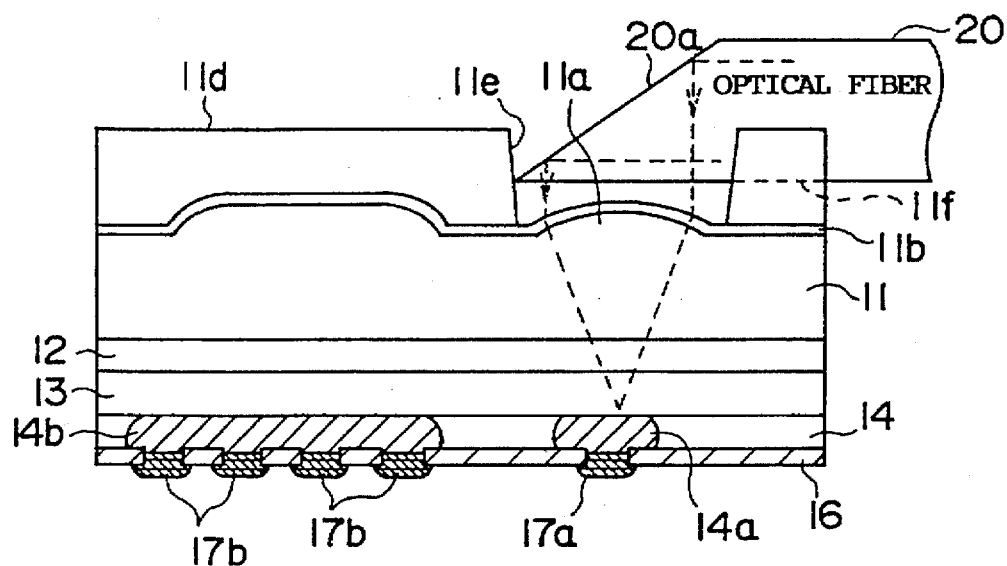
FIG. 34 is a diagram showing another modification of the semiconductor photodetection device of FIG. 32.

Further, FIG. 34 shows a further modification of the semiconductor photodetection device of FIG. 32.

In the construction of FIG. 34, a groove 11f is formed in the polyimide layer 11d such that the groove 11f has a size corresponding to the outer size of the optical fiber 20 and extends substantially parallel to the principal surface of the substrate 11, wherein the groove 11f reaches the foregoing aperture 11e. Thus, the optical fiber 20 is held in the groove 11f such that the end of the optical fiber 20 reaches the aperture 11e, wherein the optical fiber 20 is formed with an oblique surface 20a that acts as a mirror at the end of the optical fiber 20. Thereby, the optical signal transmitted through the optical fiber 20 is reflected by the mirror 20a to the photodiode, and the optical signal thus reflected is focused upon a region in the vicinity of the diffusion region 14a that forms the photodiode. By configuring the photodiode such that the optical fiber 20 extends parallel with the device, it is possible to reduce the overall size of the photodetection device.

Figure 35:
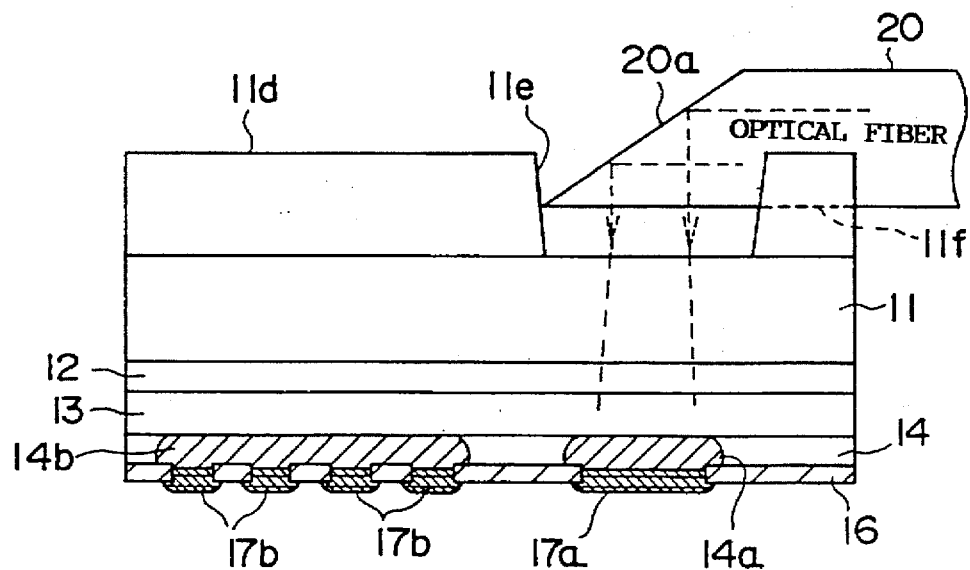
FIG. 35 is a diagram showing a further modification of the semiconductor photodetection device of FIG. 34.

FIG. 35 shows a modification of the construction of FIG. 34, wherein it will be noted that the microlens 11a is eliminated similarly to the modification of FIG. 33. As other features are obvious from the foregoing description, further description thereof will be omitted.

In the present invention, it should be noted that the semiconductor substrate 11 as well as the semiconductor layers 12–14 are not limited to InP or InGaAs described previously, but other combination of semiconductor materials may also be used. Further, the insulation layer 16 or 11d is not limited to polyimide but other resin or refractory resin may be used. Further, the metal bump is not limited to the materials described heretofore. For example, one may use an alloy of any of Au, Pt, Pd, Rh for the conductor layers $17_1$ and $17_2$. Similarly, the conductor layer $17_3$ is not limited to Sn but an alloy of Sn or other low melting metal may also be used.

Further, the present invention is not limited to the embodiments described heretofore, but various variations and modifications may be made without departing from the scope of the invention.

What is claimed is:

1. A semiconductor photodetection device, comprising:

a substrate;

a first semiconductor layer of a first conductivity type provided on said substrate;

a second semiconductor layer of said first conductivity type provided on said first semiconductor layer;

a first conductive region formed in said second semiconductor layer and having a second, opposite conductivity type;

a second conductive region formed in said second semiconductor layer with a separation from said first conductive region, said second conductive region having said second conductivity type and an area substantially larger than an area of said first conductive region;

a first metal bump provided on said second semiconductor layer in correspondence to said first conductive region, said first metal bump having a first area; and a second metal bump provided on said second semiconductor layer in correspondence to said second conductive region, said second metal bump having a second area;

said first and second metal bumps projecting from said second semiconductor layer with a substantially identical distance;

wherein said second area is at least ten times as large as said first area.

2. A semiconductor photodetection device as claimed in claim 1, wherein said second metal bump covers said second conductive region substantially entirely.

3. A semiconductor photodetection device as claimed in claim 1, wherein said second metal bump includes a plurality of bump elements each having an area substantially identical to said first area and provided commonly on said second conductive region with other bump elements, with a mutual separation.

4. A semiconductor photodetection device as claimed in claim 3, wherein said second conductive region extends continuously so as to surround said first conductive region, and wherein said plurality of bump elements are disposed so as to surround said first metal bump.

5. A semiconductor photodetection device as claimed in claim 1, wherein said second conductive region extends continuously so as to surround said first conductive region, and said second metal bump extends continuously on said second conductive region so as to surround said first metal bump.

6. A semiconductor photodetection device, comprising:

a substrate;

a first semiconductor layer of a first conductivity type provided on said substrate;

a second semiconductor layer of said first conductivity type provided on said first semiconductor layer;

a first conductive region formed in said second semiconductor layer and having a second, opposite conductivity type;

a first metal bump provided on said second semiconductor layer in correspondence to said first conductive region with a first area;

a plurality of elemental conductive regions each formed in said second semiconductor layer with a mutual separation and with a separation from said first conductive region, each of said elemental conductive regions having a second, opposite conductivity type; and a plurality of metal bump elements each provided on a corresponding one of said elemental conductive regions, each of said metal bump elements having an area identical to an area of said first metal bump;

said first metal bump and said metal bump elements projecting from said second semiconductor layer with a substantially identical distance;

wherein said plurality of metal bump elements having a total area, defined as a sum of the area of all of said metal bump elements, of at least ten times as large as said first area.

7. A semiconductor photodetection device as claimed in claim 6, wherein said plurality of elemental conductive regions are formed so as to surround said first conductive region, and wherein said plurality of metal bump elements are disposed so as to surround said first metal bump.

8. A semiconductor photodetection device, comprising:

a substrate;

a first semiconductor layer of a first conductivity type provided on said substrate;

a second semiconductor layer provided on said first semiconductor layer and having said first conductivity type;

a conductive region formed in said second semiconductor layer with a second, opposite conductivity type;

a metal bump provided on said second semiconductor layer in correspondence to said conductive region;

a first insulation layer provided on said second semiconductor layer so as to cover said conductive region, said first insulation layer having a first opening that exposes a part of said conductive region;

a second insulation layer provided on said first insulation layer so as to cover said first insulation layer, said second insulation layer having a second opening larger than said first opening such that said second opening surrounds said first opening, said second opening thereby exposing a surface of said first insulation layer;

said metal bump contacting with said conductive region via said first and second openings, said metal bump comprising:

a first conductor layer of a refractory metal filling said first opening and said second opening, said first conductor layer thereby covering said exposed surface of said first insulation layer; and a second conductor layer of a solder alloy provided on said first conductor layer.

9. A semiconductor photodetection device as claimed in claim 8, wherein a periphery of said first insulation layer has a shape which generally corresponds to a shape of a periphery of said conductive region.

10. A semiconductor photodetection device as claimed in claim 8, wherein said metal bump includes a central depression.

11. A semiconductor photodetection device, comprising:

a substrate;

a first semiconductor layer of a first conductivity type provided on said substrate;

a second semiconductor layer provided on said first semiconductor layer and having said first conductivity type;

a conductive region formed in said second semiconductor layer with a second, opposite conductivity type;

a metal bump provided on said second semiconductor layer in correspondence to said conductive region;

first insulation layer provided on said second semiconductor layer so as to cover said conductive region, Said first insulation layer having a first opening that exposes a part of said conductive region;

a second insulation layer provided on said first insulation layer so as to cover said first insulation layer, said second insulation layer having a second opening larger than said first opening such that said second opening surrounds said first opening, said second opening thereby exposing a surface of said first insulation layer;

said metal bump contacting with said conductive region via said first and second openings, said metal bump comprising:

a first conductor layer of a refractory metal filling said first opening and said second opening, said first conductor layer thereby covering said exposed surface of said first insulation layer; and a second conductor layer of a solder alloy provided on said first conductor layer, wherein a central depression is formed in correspondence to a side wall of said second opening.

12. A semiconductor photodetection device, comprising:

a substrate;

a first semiconductor layer of a first conductivity type provided on said substrate;

a second semiconductor layer provided on said first semiconductor layer and having said first conductivity type;

a conductive region formed in said second semiconductor layer with a second, opposite conductivity type;

a metal bump provided on said second semiconductor layer in correspondence to said conductive region;

first insulation layer provided on said second semiconductor layer so as to cover said conductive region, said first insulation layer having a first opening that exposes a part of said conductive region;

a second insulation layer provided on said first insulation layer so as to cover said first insulation layer, said second insulation layer having a second opening larger than said first opening such that said second opening surrounds said first opening, said second opening thereby exposing a surface of said first insulation layer;

said metal bump contacting with said conductive region via said first and second openings, said metal bump comprising:

a first conductor layer of a refractory metal filling said first opening and said second opening, said first conductor layer thereby covering said exposed surface of said first insulation layer; and a second conductor layer of a solder alloy provided on said first conductor layer, wherein said second opening is defined by a tapered side wall that is inclined with respect to a principal surface of said second insulation layer with an angle of 50°–80°.

13. A semiconductor photodetection device, comprising:

a substrate;

a first semiconductor layer of a first conductivity type provided on said substrate;

a second semiconductor layer provided on said first semiconductor layer and having said first conductivity type;

a conductive region formed in said second semiconductor layer with a second, opposite conductivity type;

a metal bump provided on said second semiconductor layer in correspondence to said conductive region;

a first insulation layer provided on said second semiconductor layer so as to cover said conductive region, said first insulation layer having a first opening that exposes a part of said conductive region;

a second insulation layer provided on said first insulation layer so as to cover said first insulation layer, said second insulation layer having a second opening larger than said first opening such that said second opening surrounds said first opening, said second opening thereby exposing a surface of said first insulation layer;

said metal bump contacting with said conductive region via said first and second openings, said metal bump comprising:

a first conductor layer of a refractory metal filling said first opening and said second opening, said first conductor layer thereby covering said exposed surface of said first insulation layer; and a second conductor layer of a solder alloy provided on said first conductor layer, wherein said metal bump includes a central depression, said central depression having an inner diameter equal to or larger than said conductive region.

14. A semiconductor photodetection device, comprising:

a substrate having first and second, mutually opposing principal surfaces;

a first semiconductor layer provided on said first principal surface of said substrate and having a first conductivity type;

a second semiconductor layer provided on said first semiconductor layer and having said first conductivity type:

a first conductive region formed in said second semiconductor layer, said first conductive region having a second, opposite conductivity type;

a second conductive region formed in said second semiconductor layer with a separation from said first conductive region, said second conductive region having said second conductivity type, said second conductive region having an area substantially larger than an area of said first conductive region;

a first metal bump provided in said second semiconductor layer in correspondence to said first conductive region, said first metal bump having a first area; and a second metal bump provided on said second semiconductor layer in correspondence to said second conductive region, said second metal bump having a second area;

said first and second metal bumps projecting from said second semiconductor layer with a substantially identical distance;

a resin layer provided on said second principal surface of said substrate;

an opening provided on said resin layer in correspondence to said first diffusion region such that said second principal surface is exposed; and an optical fiber having an end engaging with said opening, said optical fiber thereby emitting an optical signal in the vicinity of said first conductive region;

wherein said second area is at least ten times as large as said first area.

15. A semiconductor photodetection device as claimed in claim 14, wherein said optical fiber is fixed upon said resin layer in a direction vertically with respect to a principal surface of said resin layer.

16. A semiconductor photodetection device as claimed in claim 14, wherein said optical fiber is fixed upon said resin layer in a direction parallel to a principal surface of said resin layer, and wherein said optical fiber carries a reflective surface at an end thereof such that said optical signal is directed to said first conductive region via said opening.

* * * * *